United States Patent
Xie et al.

(10) Patent No.: US 12,550,712 B2
(45) Date of Patent: Feb. 10, 2026

(54) BULK SUBSTRATE BACKSIDE POWER RAIL

(71) Applicant: International Business Machines Corporation, Armonk, NY (US)

(72) Inventors: Ruilong Xie, Niskayuna, NY (US); Kisik Choi, Watervliet, NY (US); Junli Wang, Slingerlands, NY (US); Tenko Yamashita, Schenectady, NY (US)

( * ) Notice: Subject to any disclaimer, the term of this patent is extended or adjusted under 35 U.S.C. 154(b) by 748 days.

(21) Appl. No.: 17/664,775

(22) Filed: May 24, 2022

(65) Prior Publication Data
US 2023/0411290 A1 Dec. 21, 2023

(51) Int. Cl.
| | |
|---|---|
| H01L 23/528 | (2006.01) |
| H10D 30/67 | (2025.01) |
| H10D 62/10 | (2025.01) |
| H10D 84/01 | (2025.01) |
| H10D 84/03 | (2025.01) |
| H10D 84/85 | (2025.01) |

(52) U.S. Cl.
CPC ..... *H01L 23/5286* (2013.01); *H10D 30/6729* (2025.01); *H10D 30/6735* (2025.01); *H10D 30/6757* (2025.01); *H10D 62/118* (2025.01); *H10D 84/0186* (2025.01); *H10D 84/0188* (2025.01); *H10D 84/038* (2025.01); *H10D 84/85* (2025.01)

(58) Field of Classification Search
CPC ............ H10D 30/6729; H10D 62/118; H10D 84/0188; H10D 62/121; H10D 84/0149; H10D 84/83
See application file for complete search history.

(56) References Cited

U.S. PATENT DOCUMENTS

| | | |
|---|---|---|
| 9,570,395 B1 | 2/2017 | Sengupta |
| 10,586,765 B2 | 3/2020 | Smith |
| 10,636,739 B2 | 4/2020 | Beyne |
| 10,700,207 B2 | 6/2020 | Chen |
| 10,872,818 B2 | 12/2020 | Chiang |
| 2020/0105671 A1 | 4/2020 | Lai |

(Continued)

FOREIGN PATENT DOCUMENTS

EP   3651188 B1   5/2021

*Primary Examiner* — Fernando L Toledo
*Assistant Examiner* — Adam S Bowen
(74) *Attorney, Agent, or Firm* — Stosch Sabo

(57) ABSTRACT

A semiconductor structure includes a front-end-of-line level including a plurality of field effect transistors electrically connected to a back-end-of-line interconnect level located on a first side of the front-end-of-line level. A plurality of shallow trench isolation regions are located between adjacent field effect transistors, each of the plurality of shallow trench isolation regions being surrounded by a dielectric isolation liner. A backside power rail is located within a backside interlayer dielectric located on a second side of the front-end-of-line level opposing the first side of the front-end-of-line level. A via-to-backside power rail embedded, at least in part, within a shallow trench isolation region is located between two field effect transistors of a similar polarity, the via-to-backside power rail is adjacent and electrically connected to at least one metal contact and extends from the at least one metal contact to a first surface of the backside power rail.

20 Claims, 32 Drawing Sheets

(section Y-Y)

(56) References Cited

U.S. PATENT DOCUMENTS

| 2020/0266169 | A1 | 8/2020 | Kang |
| 2021/0375761 | A1 | 12/2021 | Chang |
| 2021/0375861 | A1* | 12/2021 | Chung ................ H10D 84/038 |
| 2021/0391421 | A1 | 12/2021 | Chu |

* cited by examiner (section X-X)

(section Y-Y)

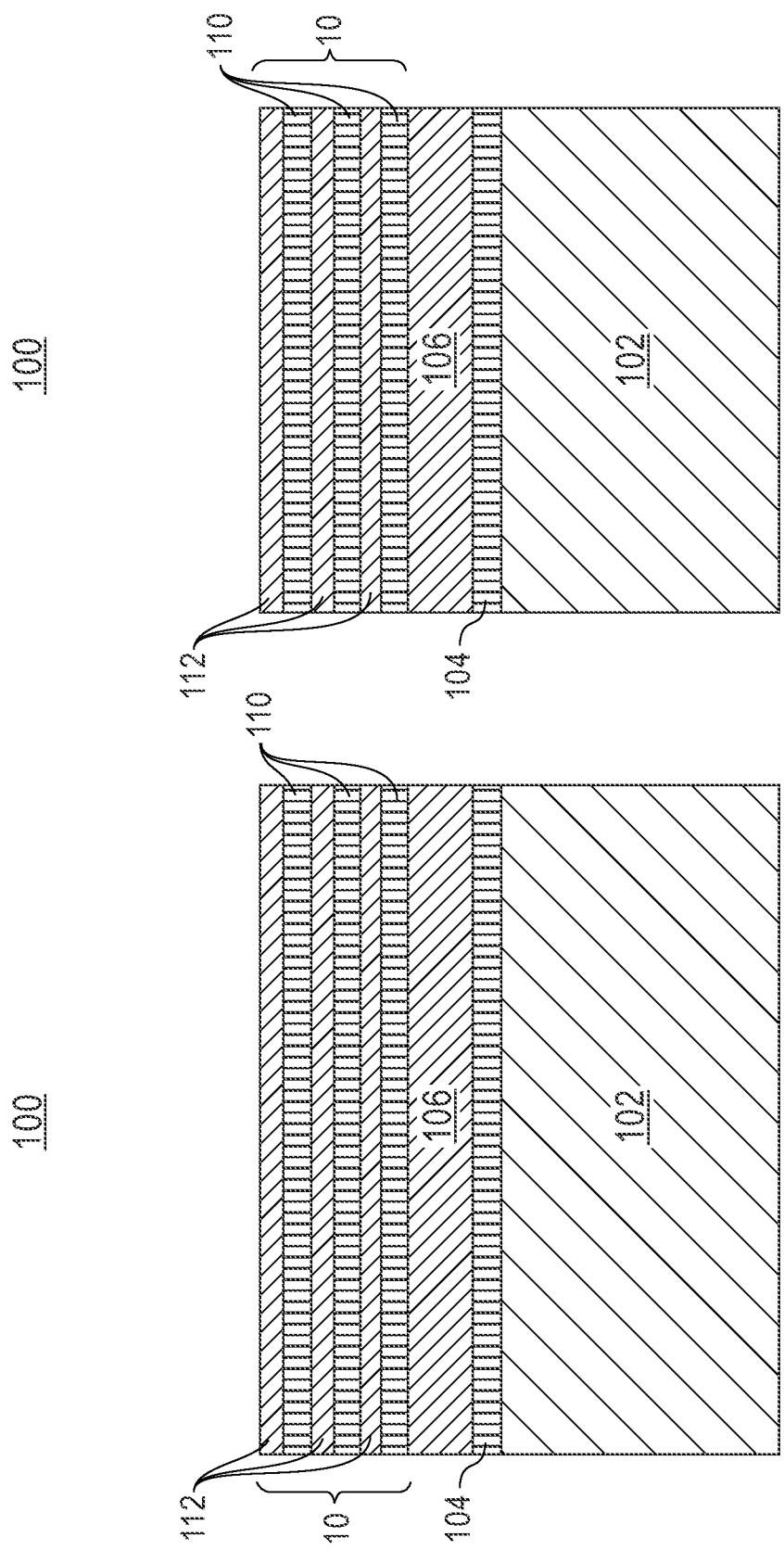

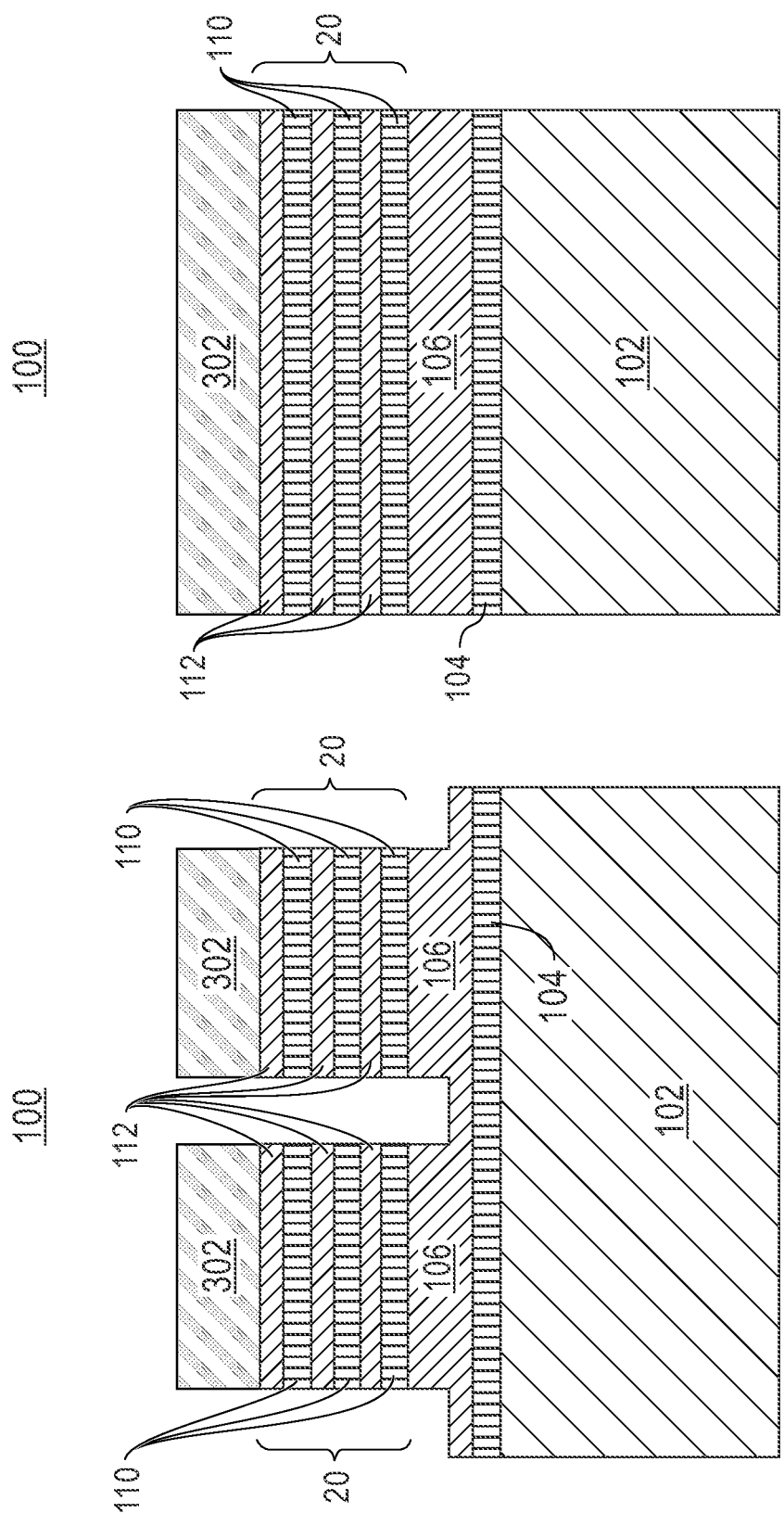

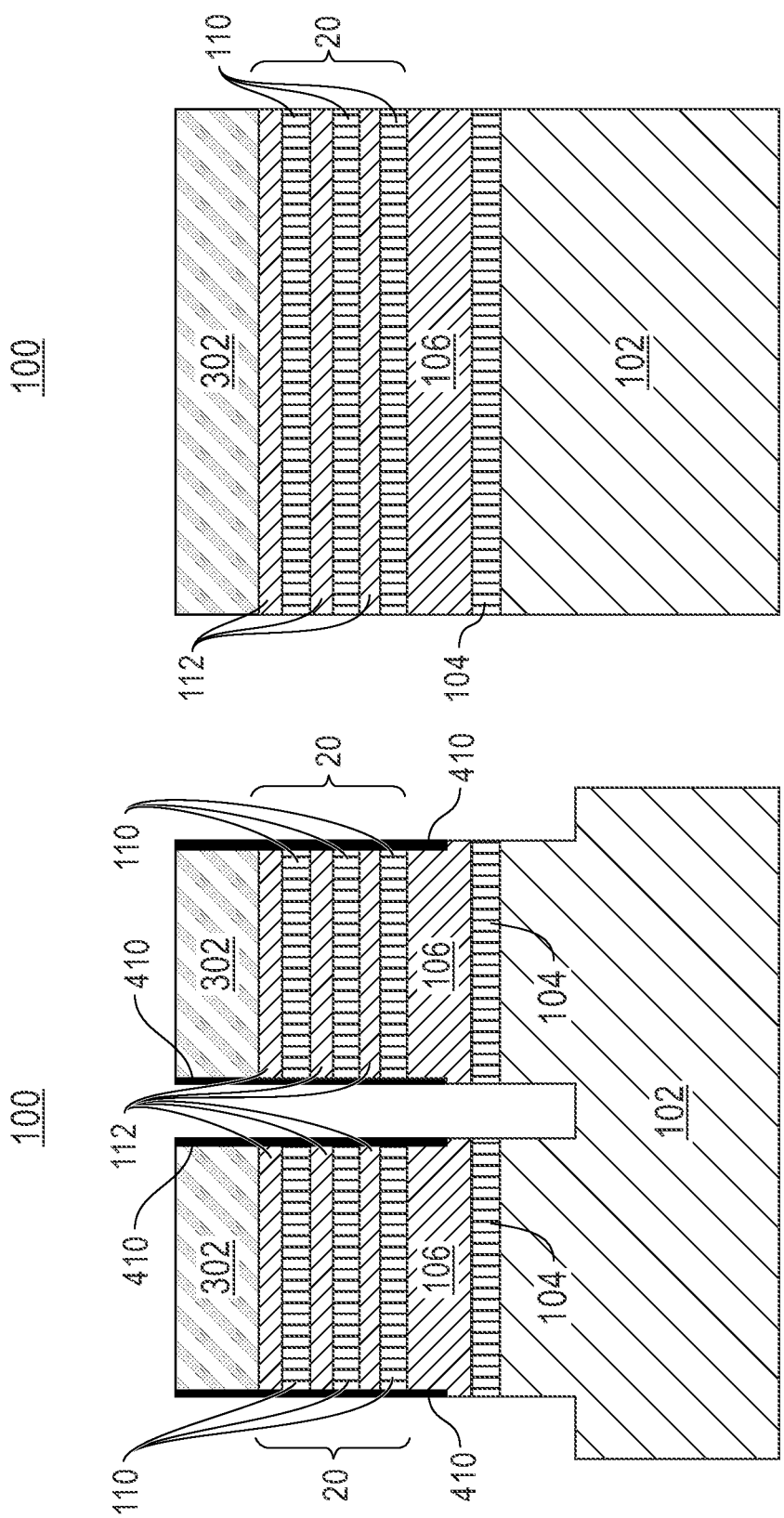

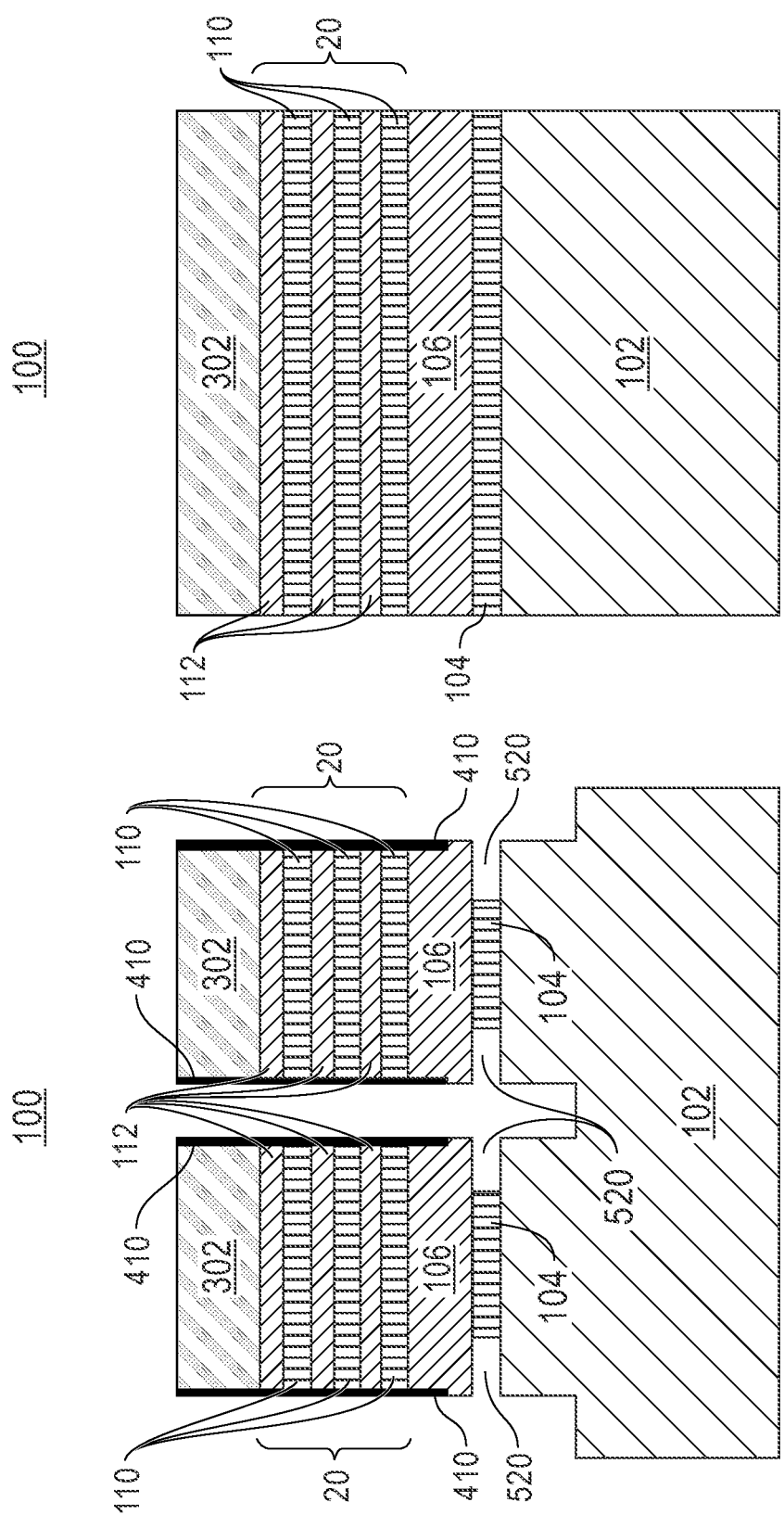

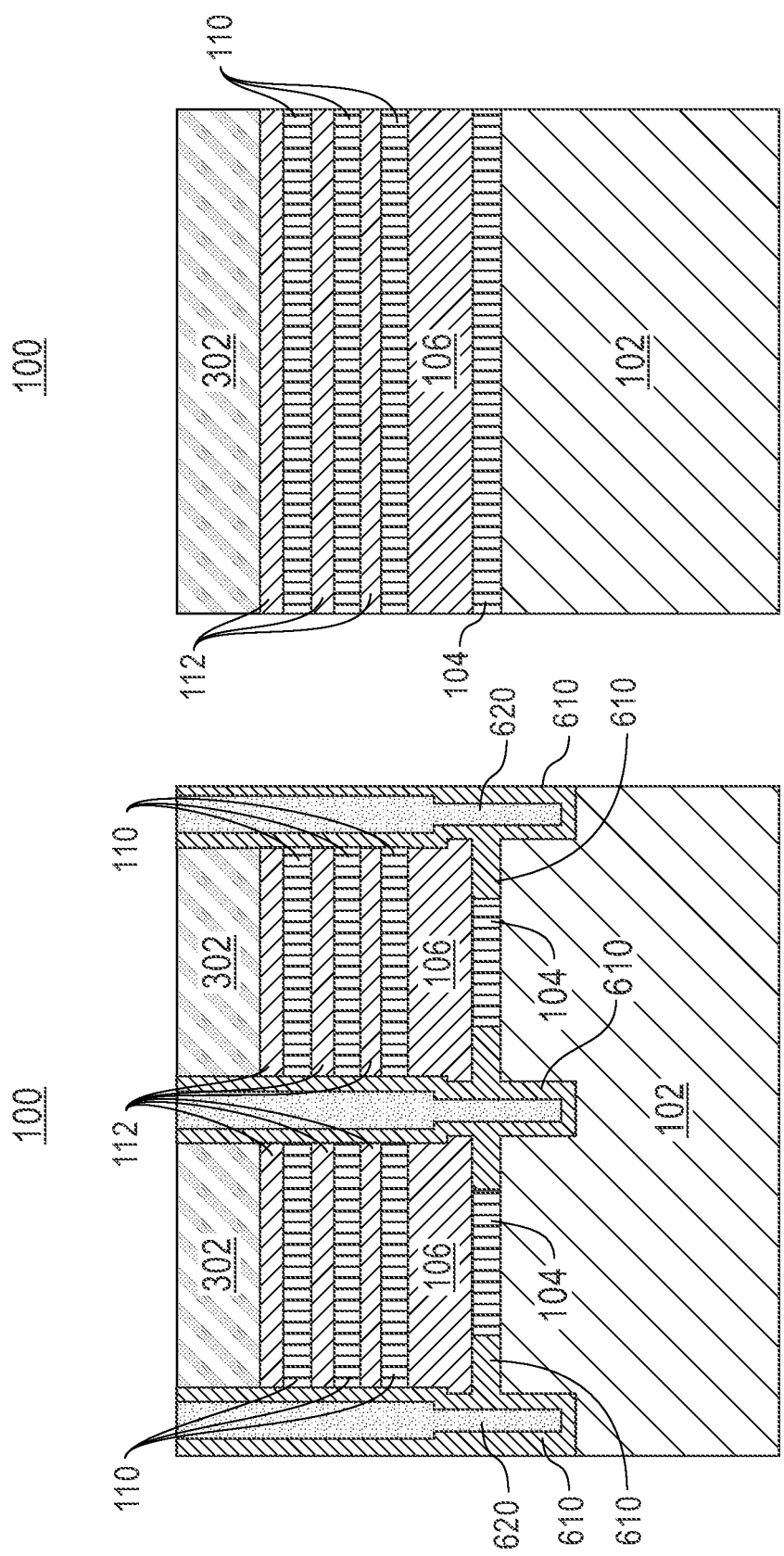

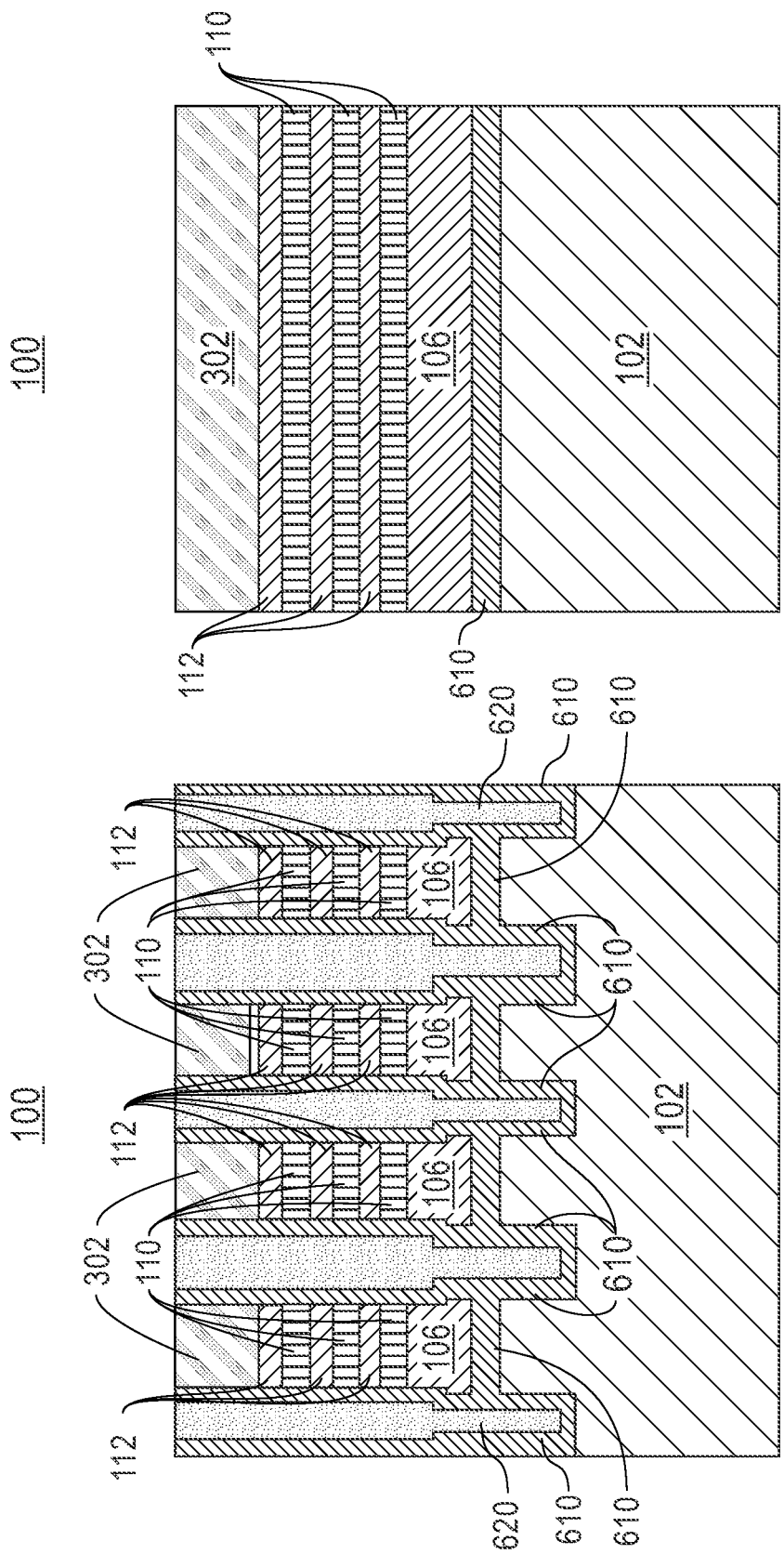
FIG. 7A (section Y-Y)
FIG. 7B (section X-X)

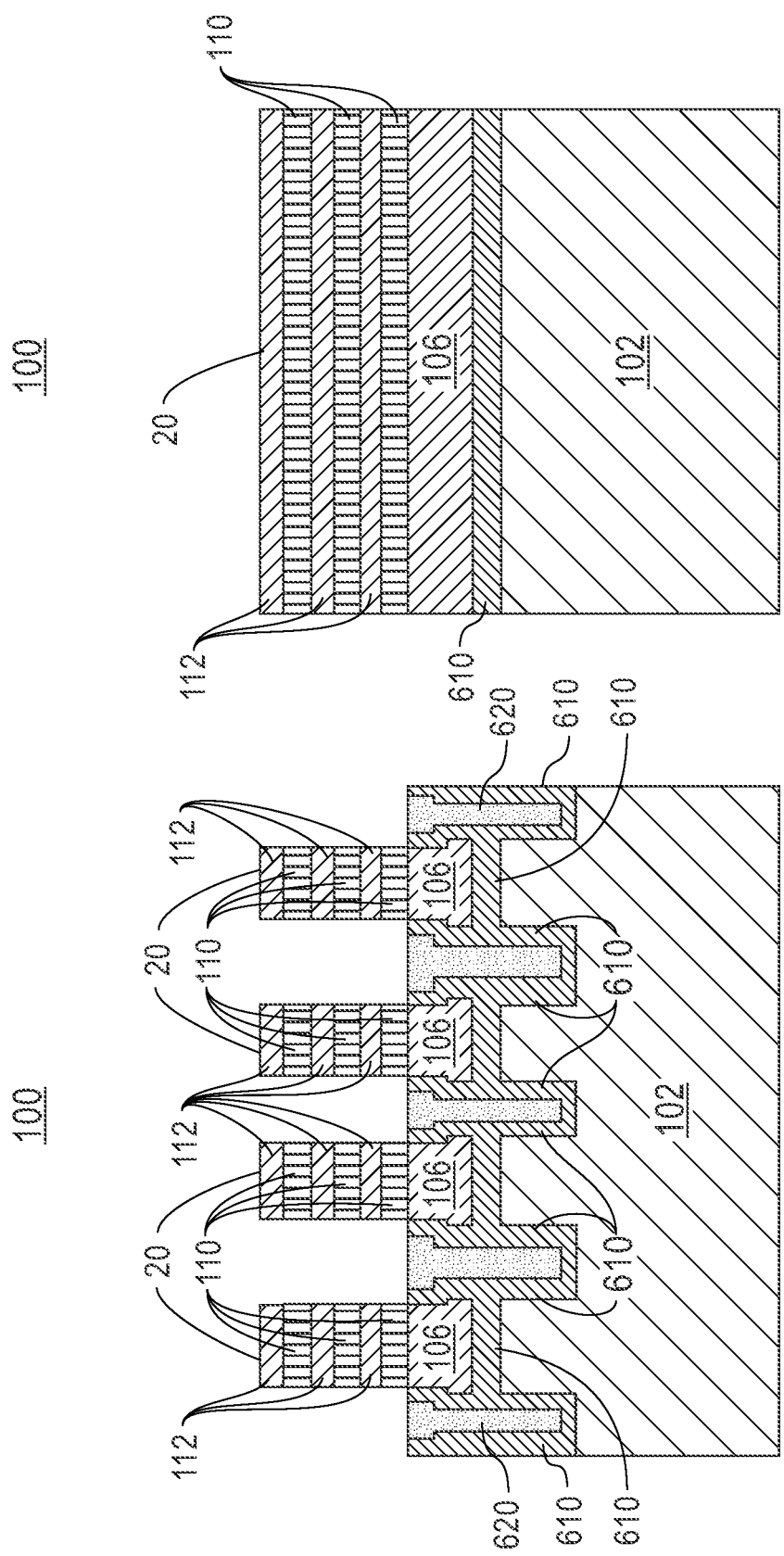

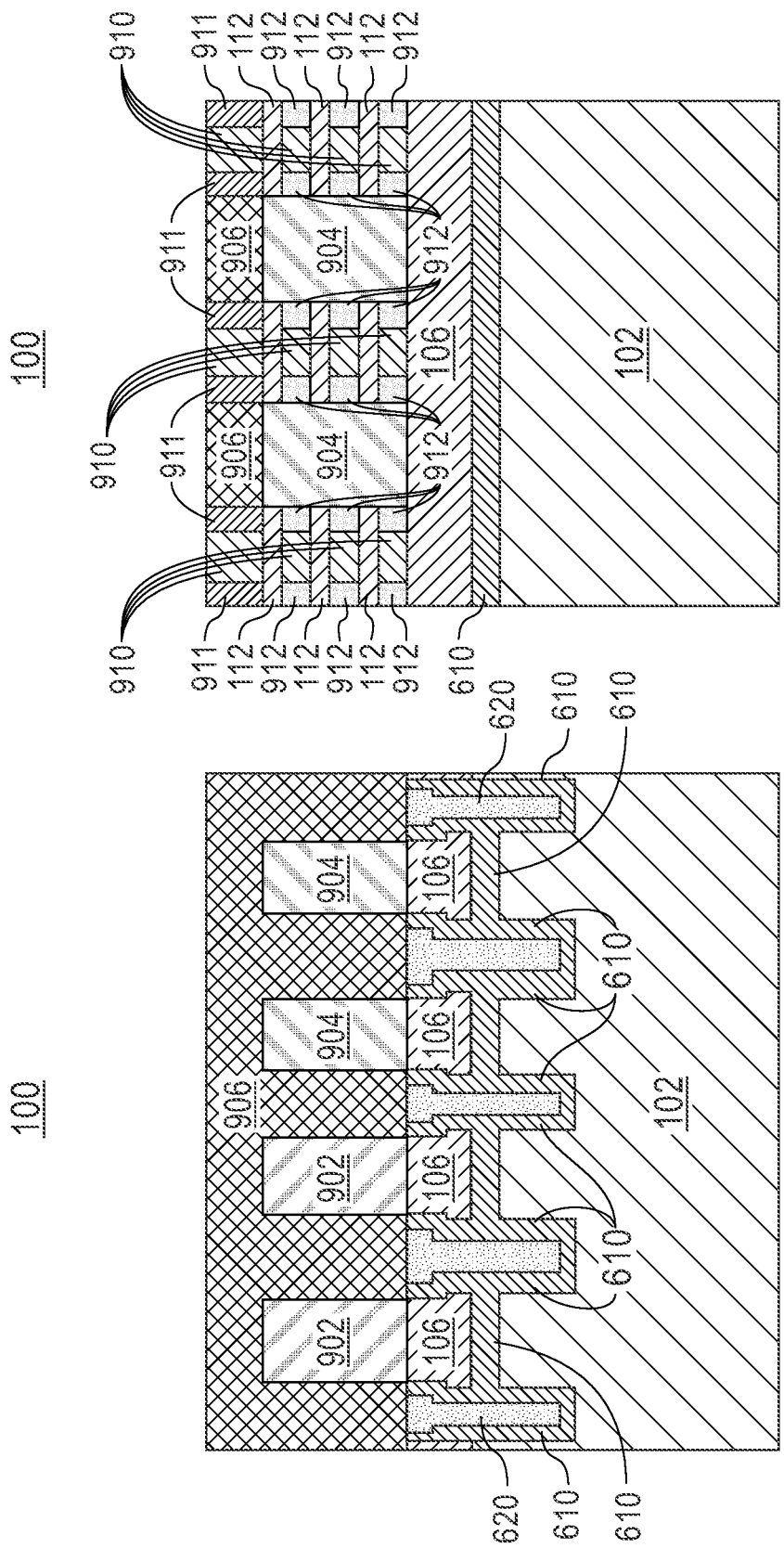

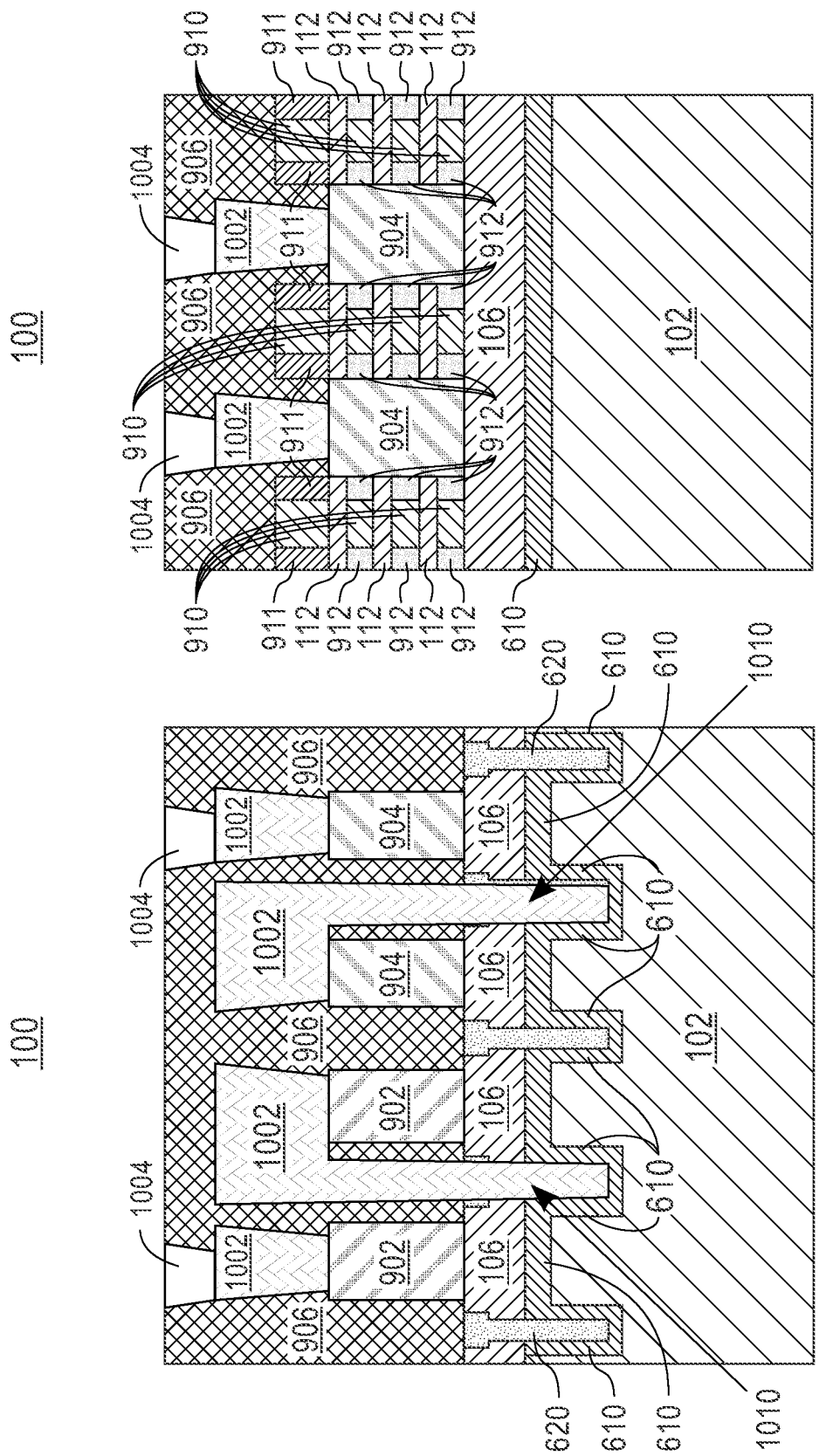
FIG. 10A (section Y-Y)
FIG. 10B (section X-X)

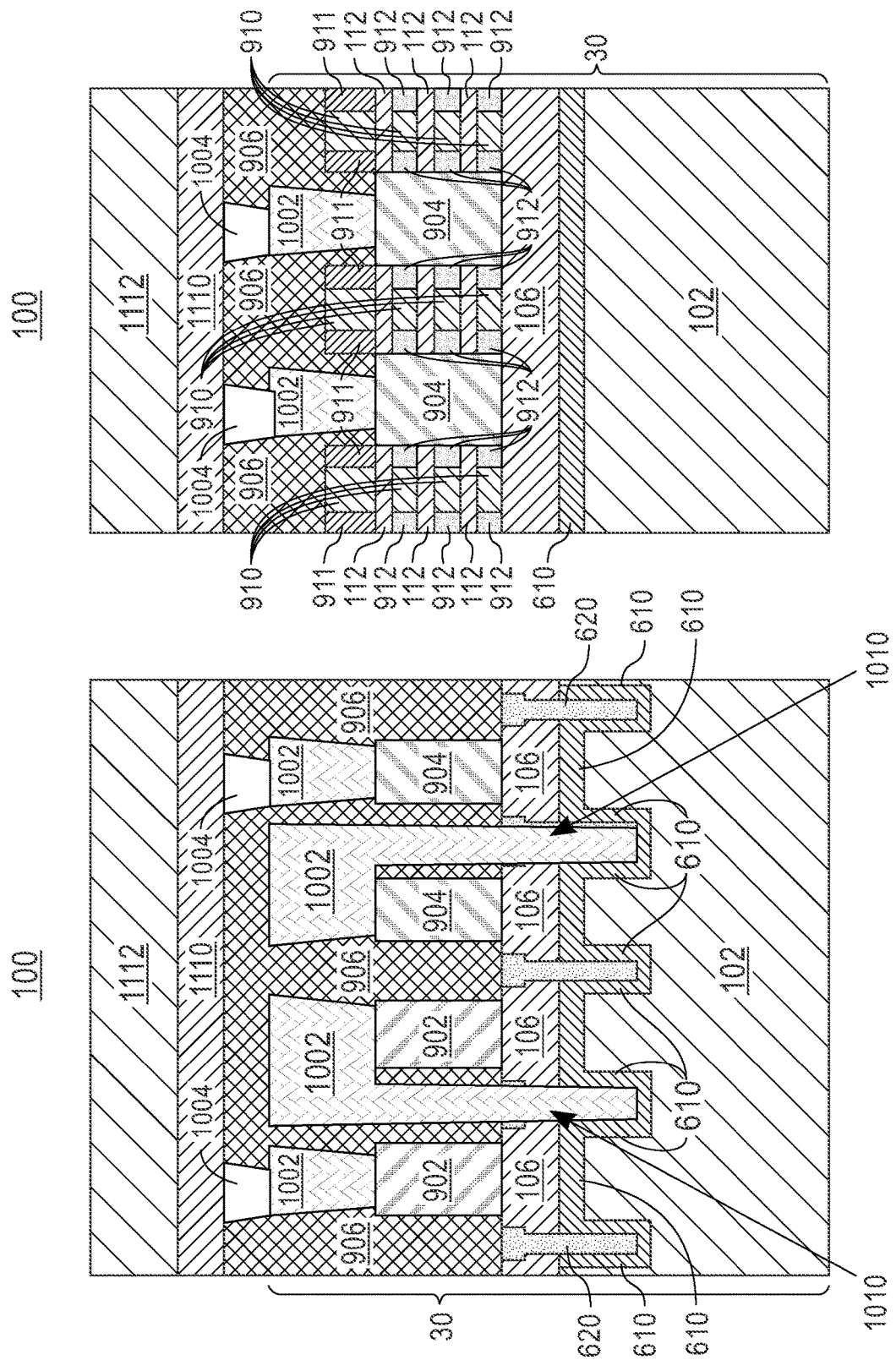

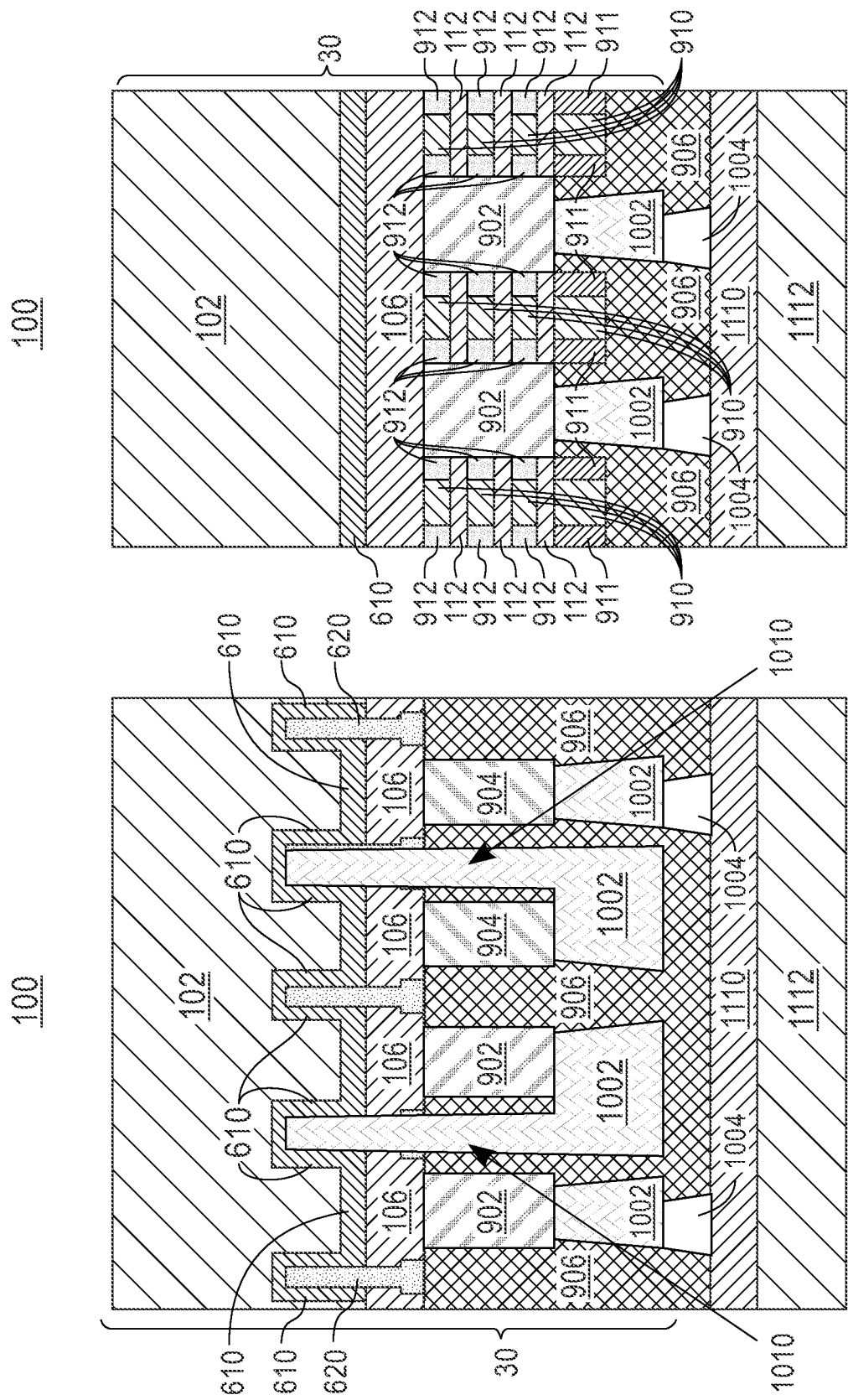

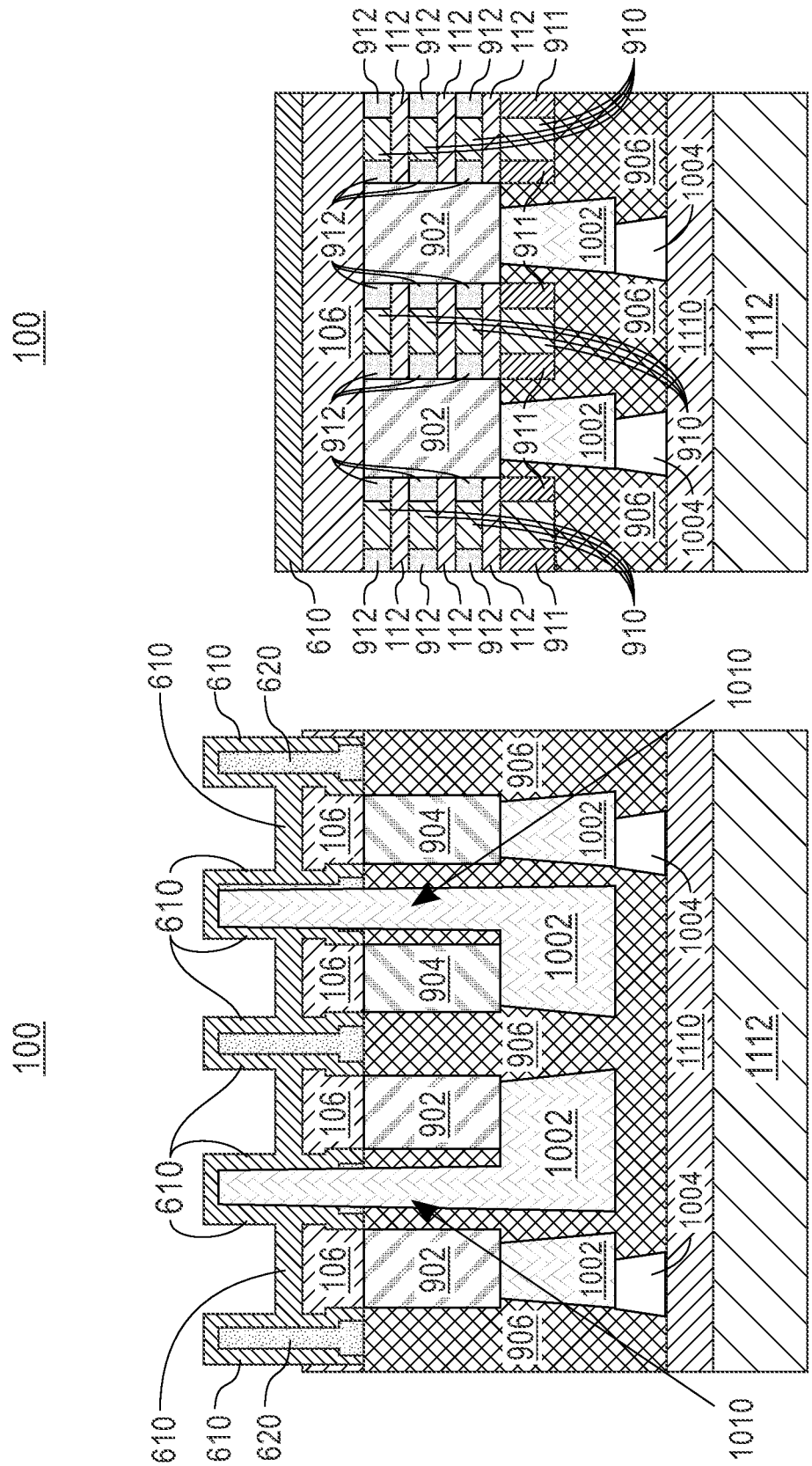

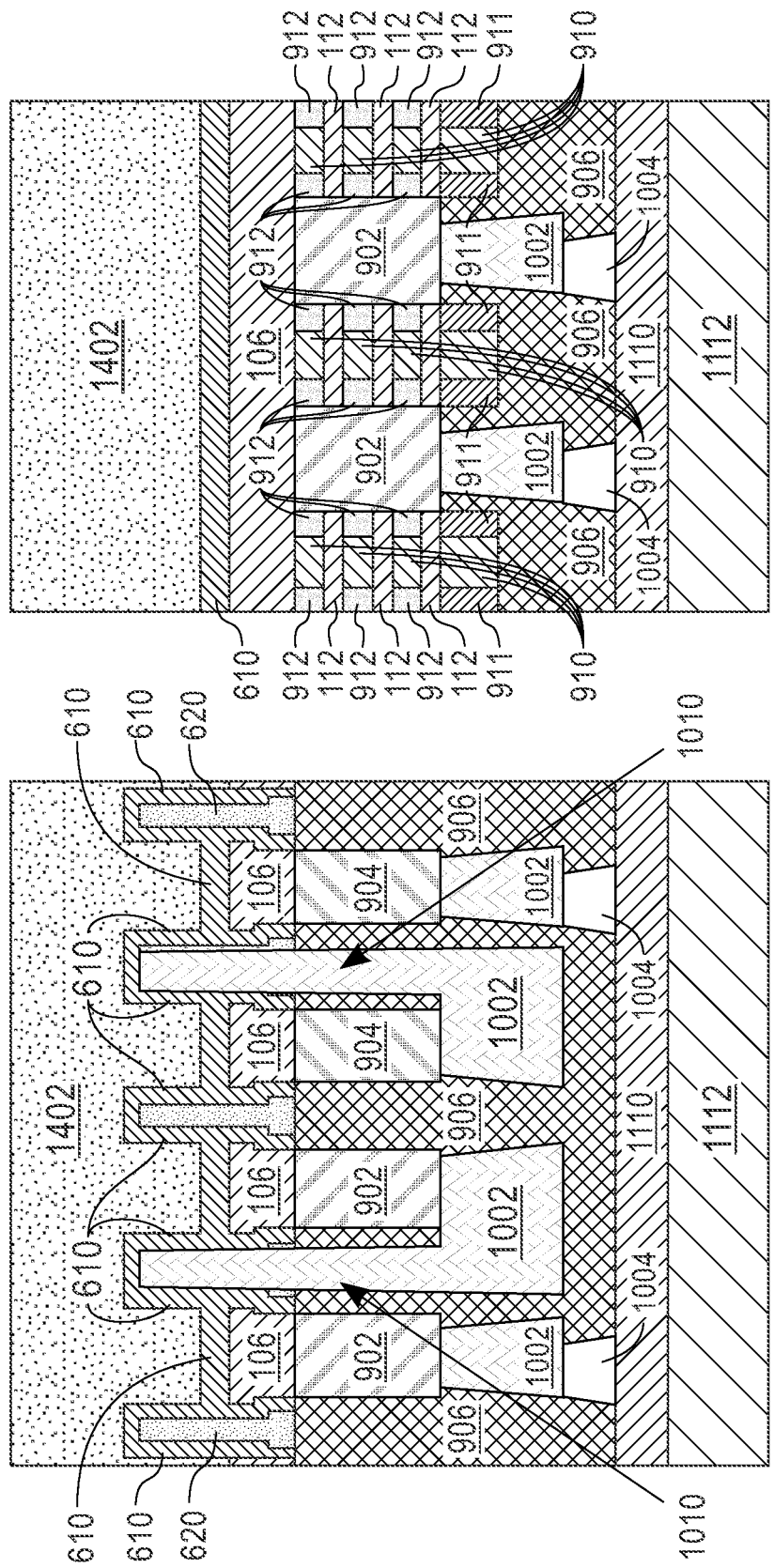
FIG. 14A (section Y-Y)
FIG. 14B (section X-X)

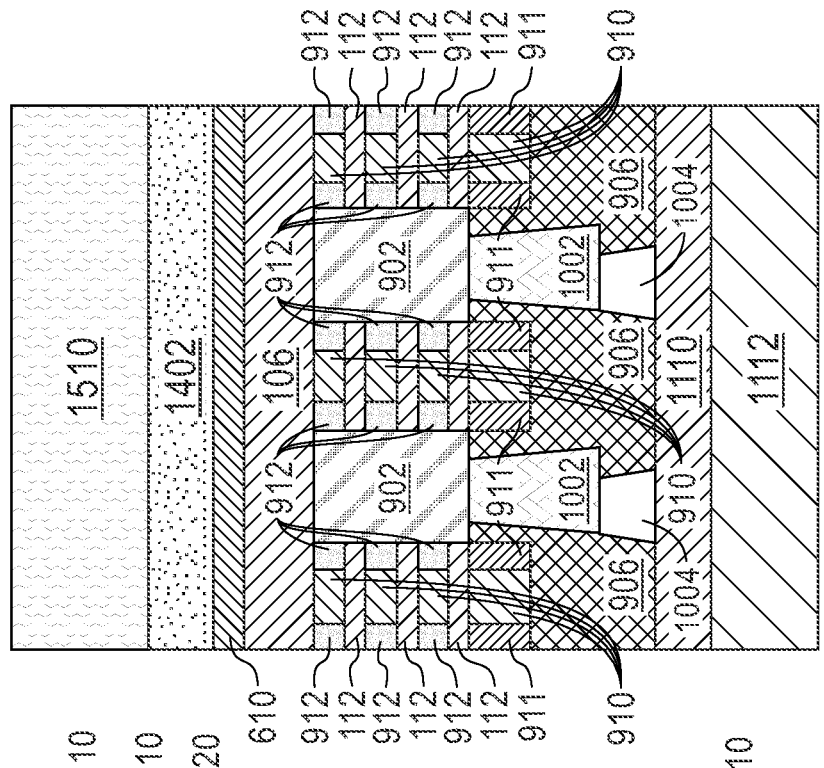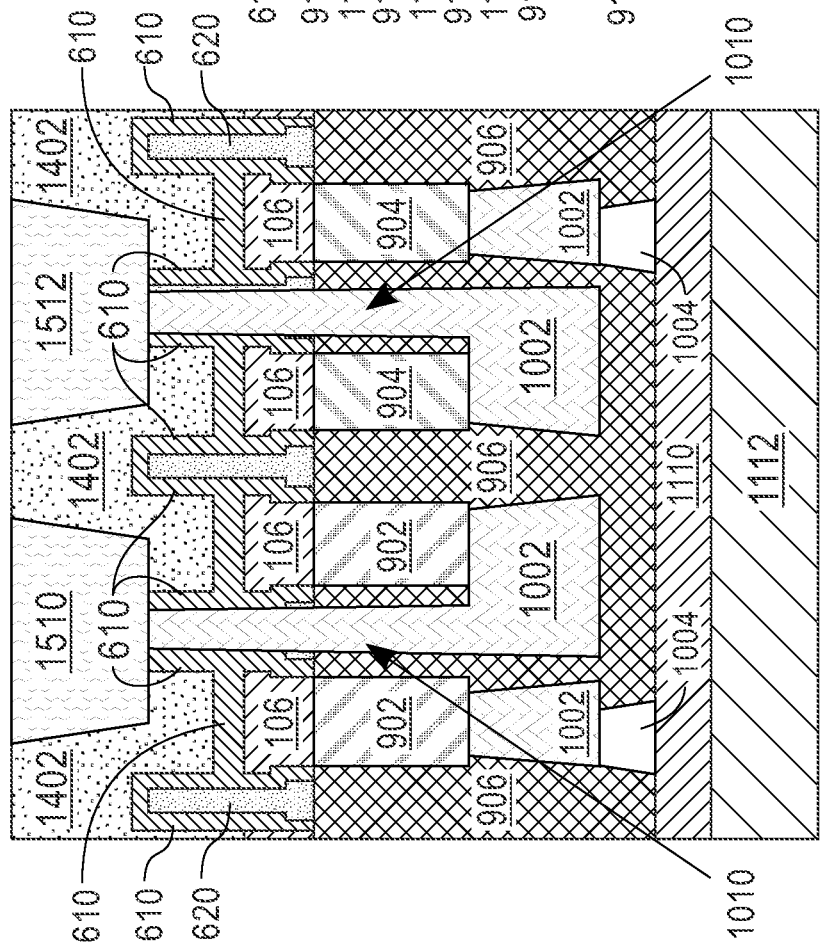
FIG. 15A (section Y-Y)
FIG. 15B (section X-X)

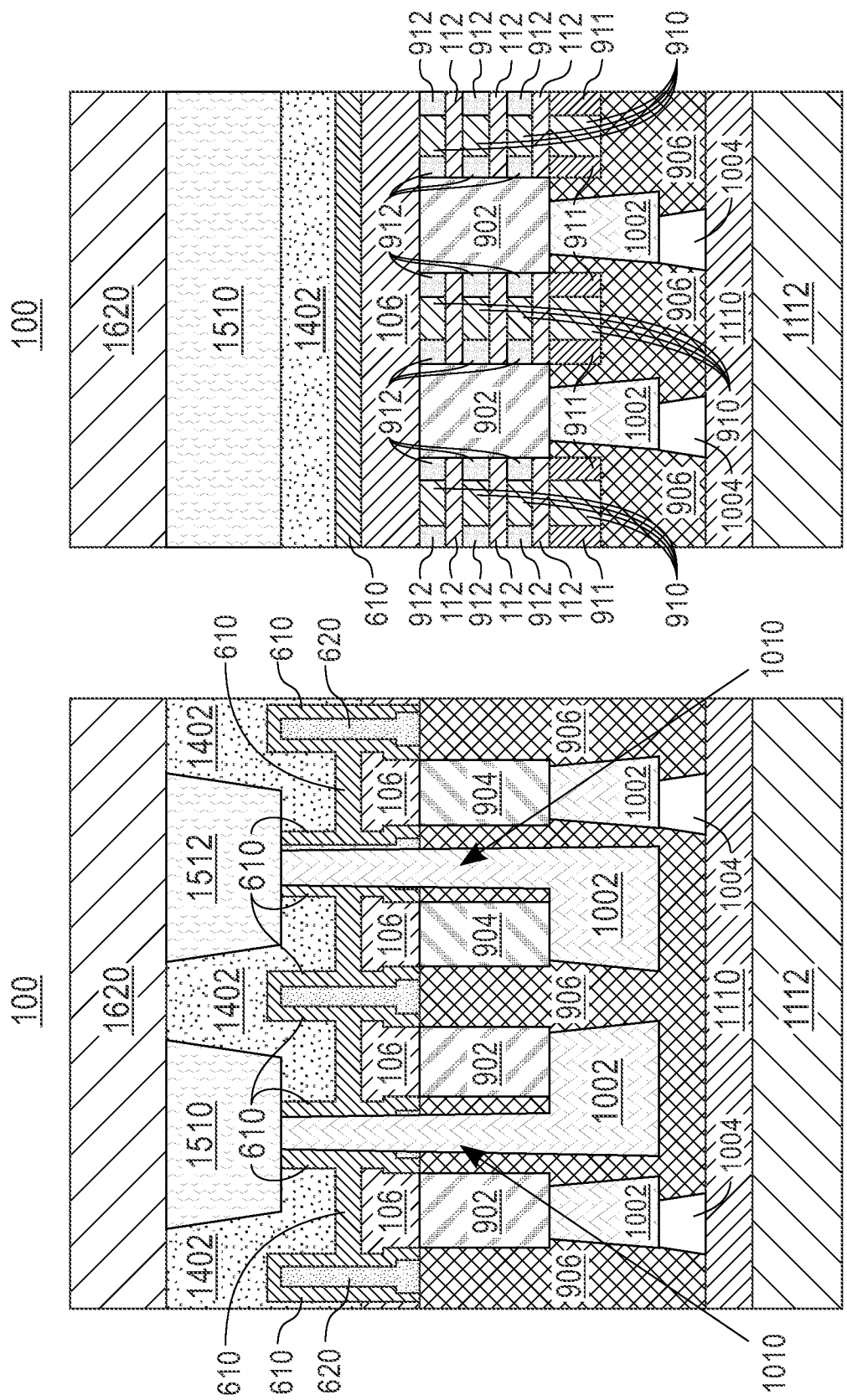
FIG. 16B (section X-X)
FIG. 16A (section Y-Y)

BULK SUBSTRATE BACKSIDE POWER RAIL

BACKGROUND

The present invention generally relates to the field of semiconductor devices, and more particularly to power delivery to active devices.

Integrated circuits (IC) are built in a stacked-up fashion, having transistors at the lowest level and interconnect (vias and wires) on top of the transistors to provide connectivity to the transistors. Power rails (e.g., metal lines for voltage sources and ground planes) are also above the transistors and may be part of the interconnect. As the integrated circuits continue to scale down, non-planar device architectures (e.g., nanosheet field effect transistors) provide increased device density and increased performance over planar devices. In such architectures, due to the limited device area, buried power rails, i.e., power rails that are "buried" below the back-end-of line (BEOL) metal stack, are used as an alternative to conventional power rails. Typical buried power rail formation is conducted in the shallow trench isolation (STI) region of the semiconductor device. However, in advanced technologies with aggressive cell scaling, there is oftentimes not enough room to place the buried power rail in the STI region. Therefore, improved designs and techniques for fabricating backside power rails (BPRs) would be desirable.

SUMMARY

According to an embodiment of the present disclosure, a semiconductor structure includes a front-end-of-line level including a plurality of field effect transistors electrically connected to a back-end-of-line interconnect level located on a first side of the front-end-of-line level, a plurality of shallow trench isolation regions located between adjacent field effect transistors, each of the plurality of shallow trench isolation regions being surrounded by a dielectric isolation liner, a backside power rail within a backside interlayer dielectric located on a second side of the front-end-of-line level opposing the first side of the front-end-of-line level, and a via-to-backside power rail embedded, at least in part, within a shallow trench isolation region located between two field effect transistors of a similar polarity, the via-to-backside power rail being adjacent and electrically connected to at least one metal contact and extending from the at least one metal contact to a first surface of the backside power rail.

According to another embodiment of the present disclosure, a semiconductor structure includes a front-end-of-line level including a plurality of field effect transistors, each field effect transistor including a source/drain region, a plurality of conductive structures within an interlevel dielectric layer, each of the plurality of conductive structures being located on a first surface of the source/drain region of each field effect transistor, a back-end-of-line interconnect level being located above a first surface of interlevel dielectric layer opposing the first surface of the source/drain region, a first semiconductor layer, where a first surface of the first semiconductor layer is in contact with a second surface of the source/drain region of each field effect transistor opposing the first surface of the source/drain region, a plurality of shallow trench isolation regions located between adjacent field effect transistors, an isolation liner surrounding each of the plurality of shallow trench isolation regions, the isolation liner being located between each of the plurality of shallow trench isolation regions and the first semiconductor layer and above a second surface of the first semiconductor layer opposing the second surface of the source/drain region, a via-to-backside power rail embedded, at least in part, within a shallow trench isolation region located between two field effect transistor of a similar polarity, the via-to-backside power rail being adjacent, and electrically connected, to a first side of at least one conductive structure, the isolation liner being located along sidewalls of a portion of the via-to-backside power rail within the shallow trench isolation region, at least another conductive structure being electrically connected to the back-end-of-line interconnect level through a middle-of-line via, and a backside power rail within a backside interlayer dielectric, a first surface of the backside interlayer dielectric being in contact with the isolation liner, the via-to-backside power rail extending from the at least one conductive structure to a first surface of the backside power rail.

According to another embodiment of the present disclosure, a method of forming a semiconductor structure includes forming a front-end-of-line level including a plurality of field effect transistors electrically connected to a back-end-of-line interconnect level located on a first side of the plurality of field effect transistors through a middle-of-line via, forming a plurality of shallow trench isolation regions located between adjacent field effect transistors, each of the plurality of shallow trench isolation regions being surrounded by a dielectric isolation liner, forming a backside power rail within a backside interlayer dielectric located on a second side of the plurality of field effect transistors opposing the first side, and forming a via-to-backside power rail embedded, at least in part, within a shallow trench isolation region located between two field effect transistors including a similar polarity, the via-to-backside power rail being adjacent and electrically connected to at least one metal contact and extending from the at least one metal contact to a first surface of the backside power rail.

BRIEF DESCRIPTION OF THE DRAWINGS

The following detailed description, given by way of example and not intended to limit the invention solely thereto, will best be appreciated in conjunction with the accompanying drawings, in which:

FIG. 2A is a cross-sectional view of the semiconductor structure taken along Y-Y after forming a nanosheet stack, according to an embodiment of the present disclosure;

FIG. 2B is a cross-sectional view of the semiconductor structure taken along line X-X, according to an embodiment of the present disclosure;

FIG. 3A is a cross-sectional view of the semiconductor structure taken along Y-Y after patterning nanosheet fins, according to an embodiment of the present disclosure;

FIG. 3B is a cross-sectional view of the semiconductor structure taken along line X-X, according to an embodiment of the present disclosure;

FIG. 4A is a cross-sectional view of the semiconductor structure taken along Y-Y after forming a protective liner and conducting a second etching process, according to an embodiment of the present disclosure;

FIG. 4B is a cross-sectional view of the semiconductor structure taken along line X-X, according to an embodiment of the present disclosure;

FIG. 5A is a cross-sectional view of the semiconductor structure taken along Y-Y after recessing outer portions of a first sacrificial semiconductor layer, according to an embodiment of the present disclosure;

FIG. 5B is a cross-sectional view of the semiconductor structure taken along line X-X, according to an embodiment of the present disclosure;

FIG. 6A is a cross-sectional view of the semiconductor structure taken along line Y-Y after selectively removing the protective liner and forming a dielectric isolation liner followed by shallow trench isolation regions, according to an embodiment of the present disclosure;

FIG. 6B is a cross-sectional view of the semiconductor structure taken along line X-X, according to an embodiment of the present disclosure;

FIG. 7A is a cross-sectional view of the semiconductor structure taken along Y-Y after forming shallow trench isolation regions between cell boundaries, according to an embodiment of the present disclosure;

FIG. 7B is a cross-sectional view of the semiconductor structure taken along line X-X, according to an embodiment of the present disclosure;

FIG. 8A is a cross-sectional view of the semiconductor structure taken along Y-Y after revealing the nanosheet fins, according to an embodiment of the present disclosure;

FIG. 8B is a cross-sectional view of the semiconductor structure taken along line X-X, according to an embodiment of the present disclosure;

FIG. 9A is a cross-sectional view of the semiconductor structure taken along Y-Y after completing front-end-of-line processing steps, according to an embodiment of the present disclosure;

FIG. 9B is a cross-sectional view of the semiconductor structure taken along line X-X, according to an embodiment of the present disclosure;

FIG. 10A is a cross-sectional view of the semiconductor structure taken along Y-Y after middle-of-line contact metallization, according to an embodiment of the present disclosure;

FIG. 10B is a cross-sectional view of the semiconductor structure taken along line X-X, according to an embodiment of the present disclosure;

FIG. 11A is a cross-sectional view of the semiconductor structure taken along Y-Y after forming a back-end-of-line interconnect level and a carrier wafer, according to an embodiment of the present disclosure;

FIG. 11B is a cross-sectional view of the semiconductor structure taken along line X-X, according to an embodiment of the present disclosure;

FIG. 12A is a cross-sectional view of the semiconductor structure taken along Y-Y after wafer flip, according to an embodiment of the present disclosure;

FIG. 12B is a cross-sectional view of the semiconductor structure taken along line X-X, according to an embodiment of the present disclosure;

FIG. 13A is a cross-sectional view of the semiconductor structure taken along Y-Y after substrate grinding, according to an embodiment of the present disclosure;

FIG. 13B is a cross-sectional view of the semiconductor structure taken along line X-X, according to an embodiment of the present disclosure;

FIG. 14A is a cross-sectional view of the semiconductor structure taken along Y-Y after forming a backside interlevel dielectric layer, according to an embodiment of the present disclosure;

FIG. 14B is a cross-sectional view of the semiconductor structure taken along line X-X, according to an embodiment of the present disclosure;

FIG. 15A is a cross-sectional view of the semiconductor structure taken along Y-Y after backside power rail patterning and metallization, according to an embodiment of the present disclosure;

FIG. 15B is a cross-sectional view of the semiconductor structure taken along line X-X, according to an embodiment of the present disclosure;

FIG. 16A is a cross-sectional view of the semiconductor structure taken along Y-Y after forming a backside power delivery network, according to an embodiment of the present disclosure;

FIG. 16B is a cross-sectional view of the semiconductor structure taken along line X-X, according to an embodiment of the present disclosure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1B:
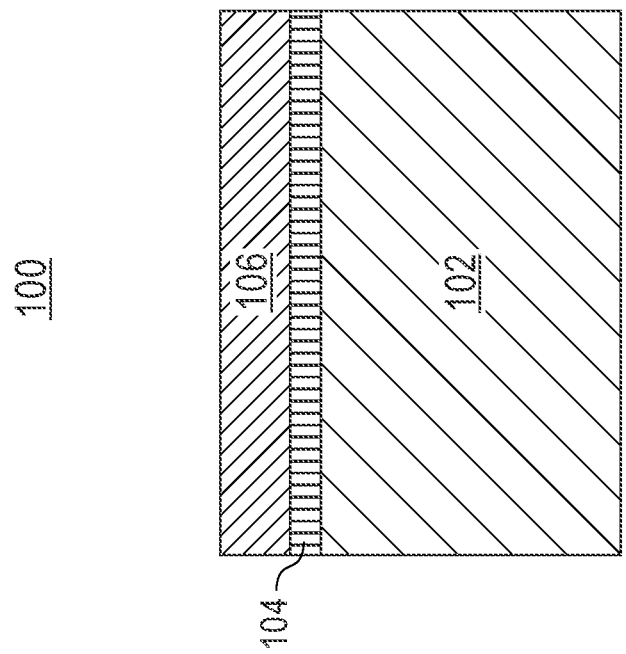
FIG. 1B is a cross-sectional view of the semiconductor structure taken along line X-X, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

Modern integrated circuits are made up of transistors, capacitors, and other devices that are formed on semiconductor substrates. On a substrate, these devices are initially isolated from one another but are later interconnected together to form functional circuits. Typical interconnect structures include lateral interconnections, such as metal lines (wirings), and vertical interconnects, such as vias and contacts. Power is provided to the integrated circuits through power rails, which are in the metal layers of integrated circuits. For example, the bottom metal layer (Mo or MO may include a plurality of metal lines such as VDD power rails and VSS power rails.

As integrated circuits continue to scale downward in size, backside power rails (BPRs), i.e., power rails that are formed in the backside of the wafer, usually under the transistor "fins", and backside power delivery ("backside" is below the transistor substrate) have been proposed to alleviate design challenges and enable technology scaling beyond the 5 nm technology node. The BPR technology can free up resources for dense logic connections that limit modern processor performance, enable further scaling of a standard logic cell by removing the overhead in the area occupied by the power rails, and allow thicker low-resistance power rails that enable lower voltage (IR) drops.

Thus, embodiments of the present disclosure provide a semiconductor structure, and a method of making the same, in which an etch stop layer or dielectric isolation liner allows backside substrate thinning for backside power rail (BPR) formation. Specifically, in the proposed semiconductor structure, a continuous dielectric isolation liner wraps around the shallow trench isolation (STI) regions of the device for separating the (bulk) substrate from a backside interlevel dielectric (BILD) and allowing the formation of a backside power rail in the BILD. Moreover, the proposed BPR is electrically connected to active devices through a via-to-BPR (VBPR) formed within at least one of the STI regions.

An embodiment by which the semiconductor structure having a backside power rail can be formed is described in detailed below by referring to the accompanying drawings in FIGS. 1A-16C.

Figure 1A:
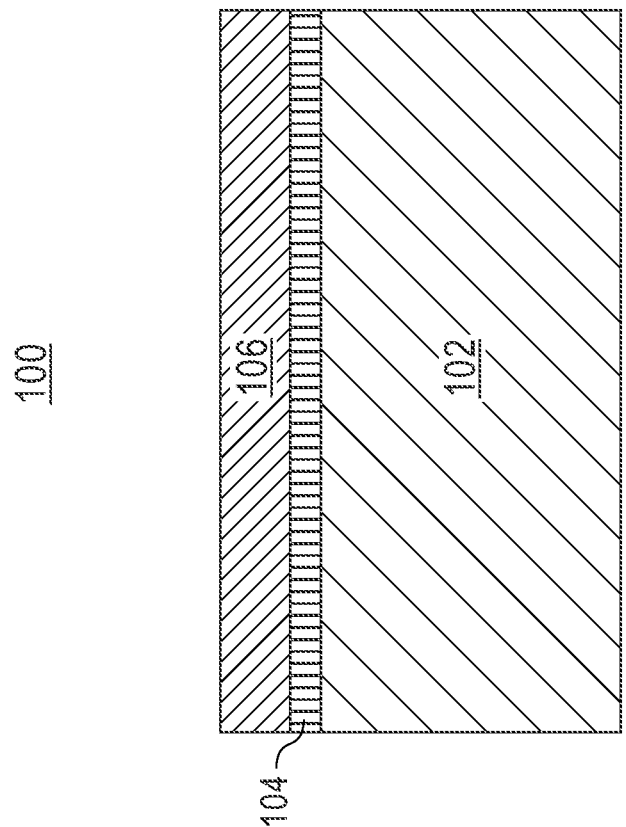
FIG. 1A is a cross-sectional view of a semiconductor structure taken along Y-Y during an intermediate step of a semiconductor manufacturing process, according to an embodiment of the present disclosure.
Figure 1C:
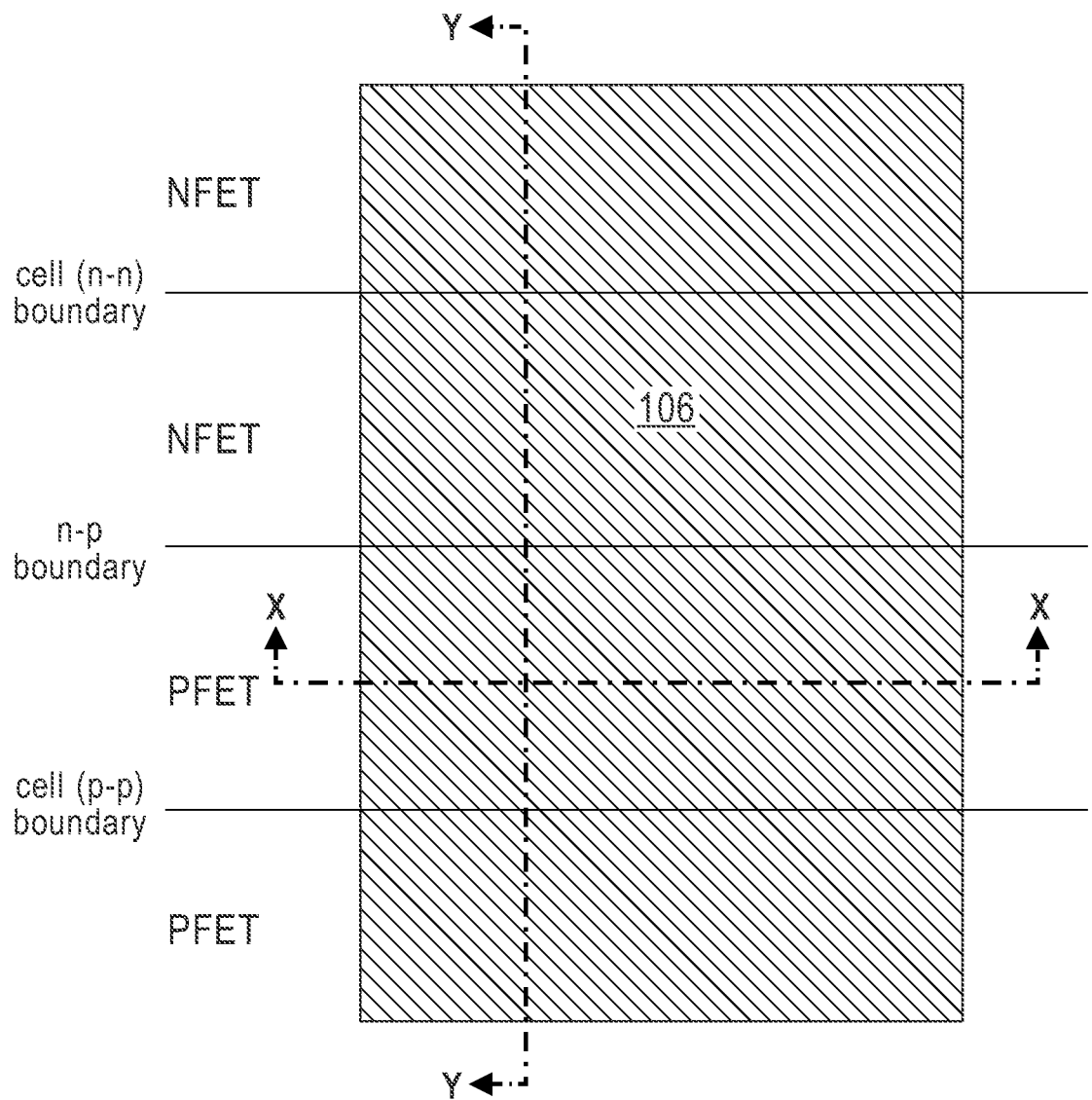
FIG. 1C is a top-down view of the semiconductor structure depicting different cross-sectional views used to describe embodiments of the present disclosure.

Referring now to FIG. 1A, a cross-sectional view of a semiconductor structure 100 is shown during an intermediate step of a semiconductor manufacturing process, according to an embodiment of the present disclosure. In this embodiment, FIG. 1A is a cross-sectional view of the semiconductor structure 100 taken along Y-Y' depicted in FIG. 1C; FIG. 1B is a cross-sectional view of the semiconductor structure 100 taken along line X-X' depicted in FIG. 1C; and FIG. 1C is a top-down view of the semiconductor structure 100 depicting different cross-sectional views used to describe embodiments of the present disclosure. FIG. 1C further depicts PFET and NFET regions of the semiconductor structure 100, as well as n-p and cell boundaries.

In the depicted example, the semiconductor structure 100 includes a substrate 102, a first sacrificial semiconductor layer 104 located above the substrate 102, and a first semiconductor layer 106 disposed above the first sacrificial semiconductor layer 104. According to an embodiment, the first sacrificial semiconductor layer 104 and the first semiconductor layer 106 are vertically stacked one on top of another in a direction perpendicular to the substrate 102, as illustrated in the figure.

The substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium phosphide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

With continued reference to FIGS. 1A-1C, the first sacrificial semiconductor layer 104, is formed on the substrate 102 using an epitaxial growth process. For instance, in the described embodiment, the first sacrificial semiconductor layer 104 is formed by epitaxially growing a layer of SiGe with a germanium concentration varying from approximately 15 atomic percent to approximately 35 atomic percent. In an exemplary embodiment, the first sacrificial semiconductor layer 104 can be grown to a thickness varying from approximately 4 nm to approximately 20 nm, although other thicknesses are within the contemplated scope of the invention.

Similarly, the first semiconductor layer 106 is formed by epitaxially growing a Si layer to a thickness varying from approximately 30 nm to approximately 150 nm, although other thicknesses are within the contemplated scope of the invention.

In general, the first sacrificial semiconductor layer 104 and the first semiconductor layer 106 can be formed by epitaxial growth by using the substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the first sacrificial semiconductor layer 104 and the first semiconductor layer 106. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

Figure 2C:
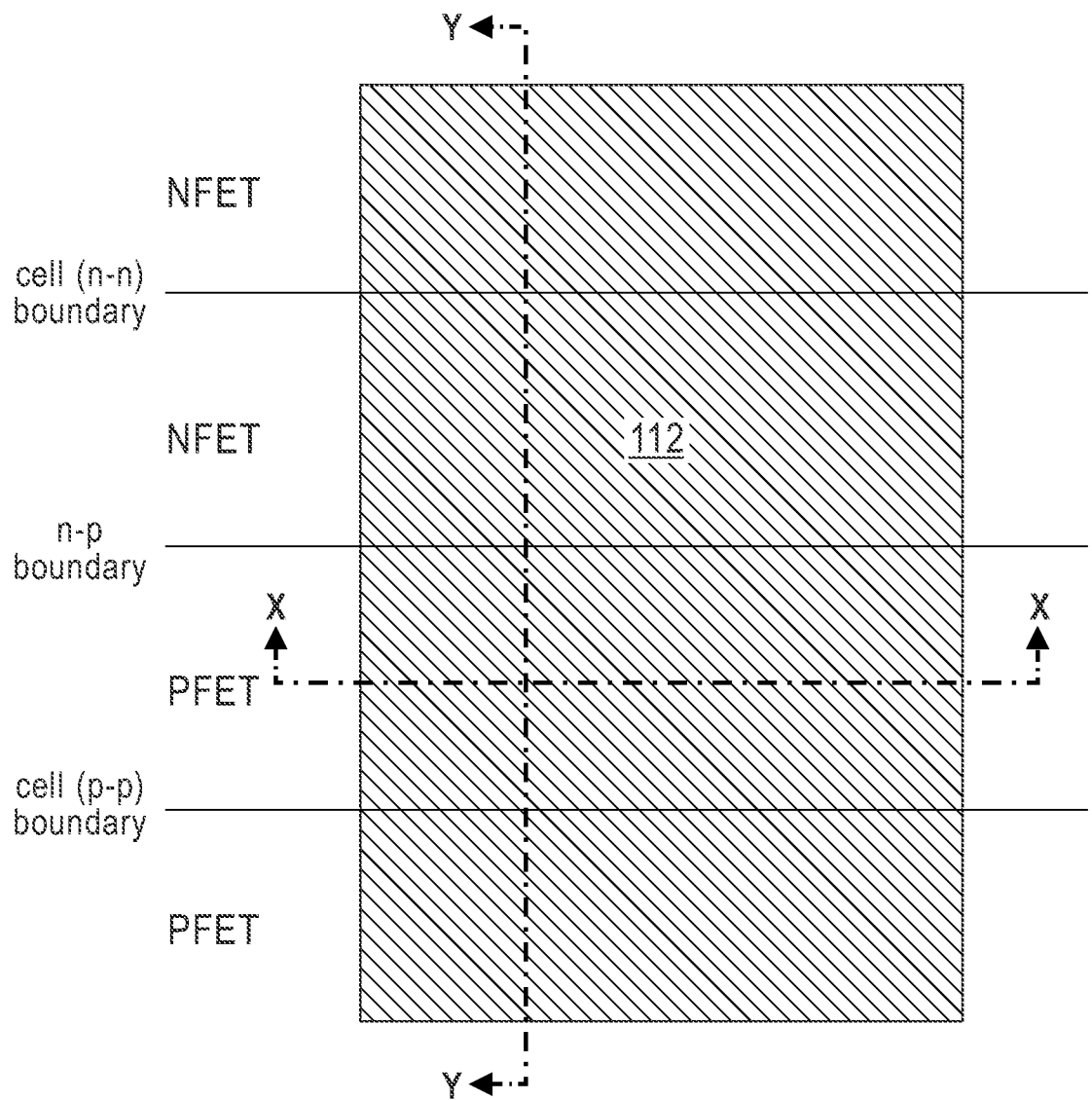
FIG. 2C is a top-down view of the semiconductor structure depicting different cross-sectional views used to describe embodiments of the present disclosure.

Referring now to FIG. 2A, a cross-sectional view of the semiconductor structure 100 is shown after forming a nanosheet stack 10 above the first semiconductor layer 106, according to an embodiment of the present disclosure. In this embodiment, FIG. 2A is a cross-sectional view of the semiconductor structure 100 taken along Y-Y' depicted in FIG. 2C; FIG. 2B is a cross-sectional view of the semiconductor structure 100 taken along line X-X' depicted in FIG. 2C; and FIG. 2C is a top-down view of the semiconductor structure 100 depicting different cross-sectional views used to describe embodiments of the present disclosure.

In the depicted embodiment, an alternating sequence of layers of sacrificial semiconductor material and layers of semiconductor channel material vertically stacked one on top of another in a direction perpendicular to the substrate 102 forms the nanosheet stack 10, as illustrated in the figure. Specifically, the alternating sequence includes a second sacrificial semiconductor layer 110 above the first semiconductor layer 106, and a semiconductor channel layer 112 above the second sacrificial semiconductor layer 110. In the example depicted in the figure, alternating second sacrificial semiconductor layers 110 and semiconductor channel layers 112 are formed in a stack above the first semiconductor layer 106. The term sacrificial, as used herein, means a layer or other structure, that is (or a part thereof is) removed before completion of the final device.

For instance, in the example being described, portions of the second sacrificial semiconductor layers 110 will be removed from the stack in the channel region of the device to permit the semiconductor channel layers 112 to be released from the nanosheet stack 10. It is notable that while in the present example the second sacrificial semiconductor layers 110 and the semiconductor channel layers 112 are made of silicon germanium (SiGe) and silicon (Si), respectively, any combination of sacrificial and channel materials may be employed in accordance with the present techniques. For example, one might instead employ selective etching technology which permits Si to be used as the sacrificial material between SiGe channel layers.

In general, layers in the nanosheet stack 10 (e.g., SiGe and Si layers) can be formed by epitaxial growth by using the first semiconductor layer 106 as the seed layer. For instance, the second sacrificial semiconductor layers 110 are formed by epitaxially growing a layer of SiGe. In this embodiment, the germanium concentration of the second sacrificial semiconductor layers 110 may vary from approximately 15 atomic percent to approximately 35 atomic percent.

To continue building the nanosheet stack 10, the semiconductor channel layers 112 are formed by epitaxially growing a Si layer. As depicted in the figure, the second sacrificial semiconductor layers 110 and the semiconductor channel layers 112 have a substantially similar or identical thickness. The nanosheet stack 10 is grown by forming (SiGe) sacrificial semiconductor layers 110 and (Si) semiconductor channel layers 112 in an alternating manner onto the first semiconductor layer 106. Accordingly, each of the second sacrificial semiconductor layers 110 and the semiconductor channel layers 112 in the nanosheet stack 10 can be formed in the same manner as described above, e.g., using an epitaxial growth process, to a thickness varying from approximately 6 nm to approximately 12 nm, although other thicknesses are within the contemplated scope of the invention.

Thus, each of the layers in the nanosheet stack 10 have nanoscale dimensions, and thus can also be referred to as nanosheets. Further, as highlighted above, the (Si) semiconductor channel layers 112 in the nanosheet stack 10 will be used to form the channel layers of the device. Consequently, the dimensions of the semiconductor channel layers 112 dictate the dimensions of the channel region of the semiconductor structure 100.

As highlighted above, the goal is to produce a stack of alternating (sacrificial and channel) SiGe and Si layers on the wafer. The number of layers in the stack can be tailored depending on the particular application. Thus, the configurations depicted and described herein are merely examples meant to illustrate the present techniques. For instance, the present nanosheet stack 10 can contain more or fewer layers than are shown in the figures.

The nanosheet stack 10 can be used to produce a gate all around device that includes vertically stacked semiconductor channel material nanosheets for a positive channel Field Effect Transistor (hereinafter "PFET") or a negative channel Field Effect Transistor (hereinafter "NFET") device.

Figure 3C:
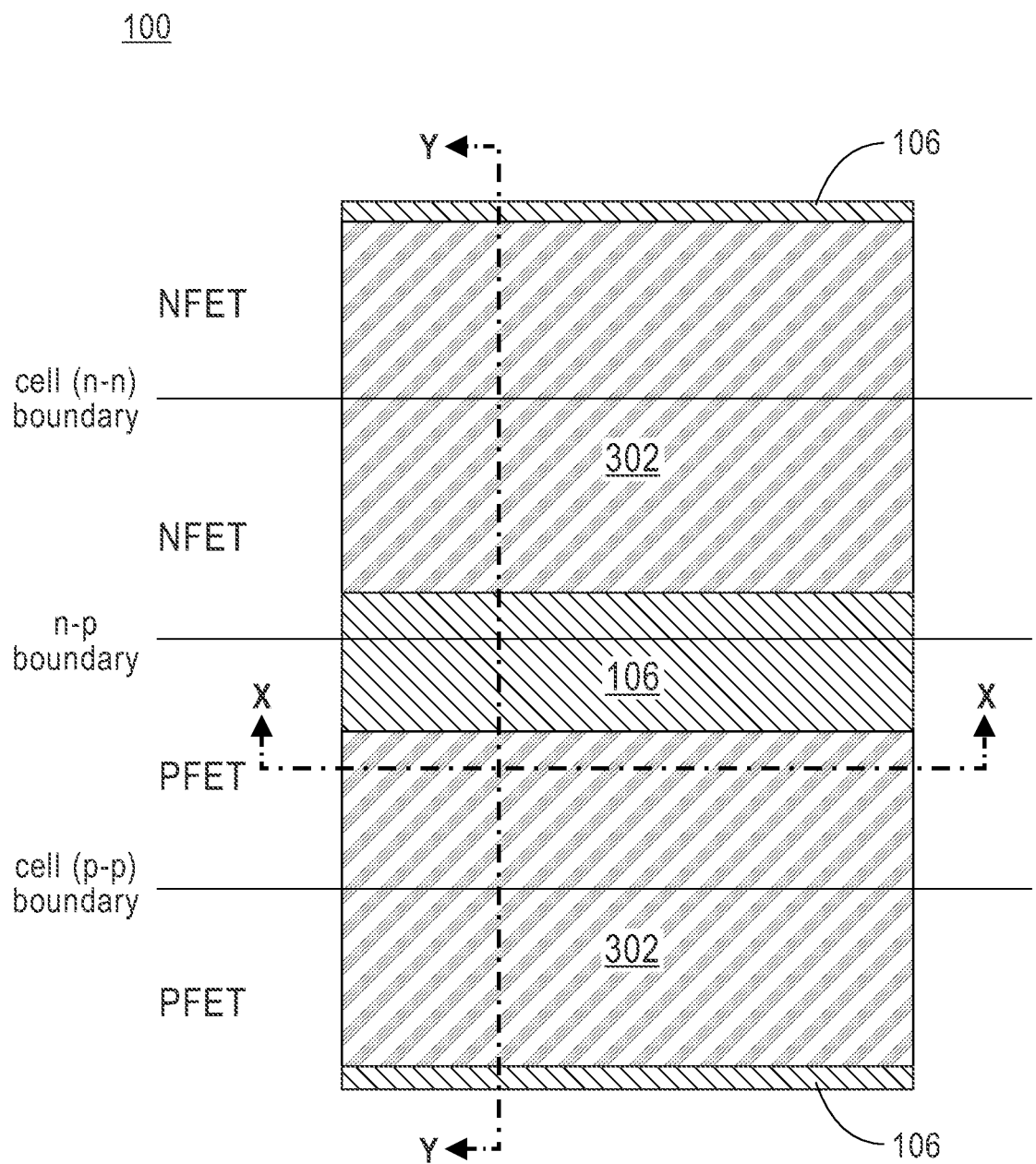
FIG. 3C is a top-down view of the semiconductor structure depicting different cross-sectional views used to describe embodiments of the present disclosure.

Referring now to FIG. 3A, a cross-sectional view of the semiconductor structure 100 is shown after patterning nanosheet fins 20, according to an embodiment of the present disclosure. In this embodiment, FIG. 3A is a cross-sectional view of the semiconductor structure 100 taken along Y-Y' depicted in FIG. 3C; FIG. 3B is a cross-sectional view of the semiconductor structure 100 taken along line X-X' depicted in FIG. 3C; and FIG. 3C is a top-down view of the semiconductor structure 100 depicting different cross-sectional views used to describe embodiments of the present disclosure.

In this embodiment, a hardmask layer 302 is formed over the nanosheet stack 10 (FIGS. 2A-2B) by depositing a hard mask material (e.g., silicon nitride) using, for example, chemical vapor deposition (CVD), plasma enhanced CVD (PECVD) or any suitable technique for dielectric deposition. By way of example only, the hardmask layer 302 may be formed having a thickness varying from approximately 20 nm to approximately 200 nm, although thicknesses greater than 200 nm and less than 20 nm may also be used.

A photolithographic patterning is then conducted on the deposited hardmask layer 302 to form a plurality of individual fin hardmasks. According to an exemplary embodiment, reactive ion etching (RIE) can be used to etch through the nanosheet stack 10 (FIGS. 2A-2B) to form nanosheet fins 20. The etching process may continue until upper portions of the first semiconductor layer 106 located between adjacent nanosheet fins 20 are removed, as illustrated in FIG. 3A. It should be noted that patterning of the nanosheet fins 20 defines an N2P space between adjacent NFET and PFET regions (n-p boundary), as shown in FIG. 3C.

Figure 4C:
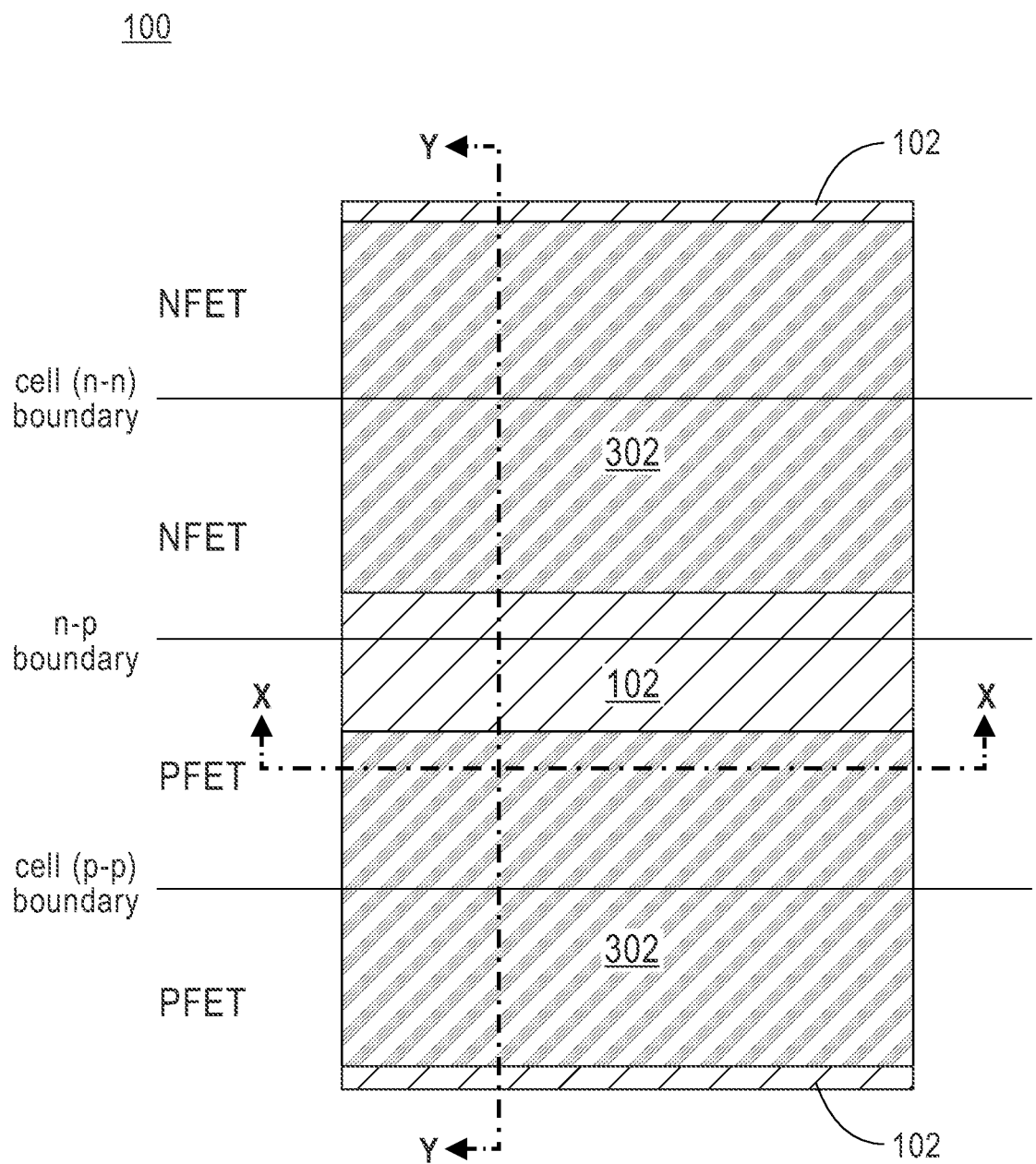
FIG. 4C is a top-down view of the semiconductor structure depicting different cross-sectional views used to describe embodiments of the present disclosure.

Referring now to FIG. 4A, a cross-sectional view of the semiconductor structure 100 is shown after forming a protective liner 410 and conducting a second etching process on the substrate 102, according to an embodiment of the present disclosure. In this embodiment, FIG. 4A is a cross-sectional view of the semiconductor structure 100 taken along Y-Y' depicted in FIG. 4C; FIG. 4B is a cross-sectional view of the semiconductor structure 100 taken along line X-X' depicted in FIG. 4C; and FIG. 4C is a top-down view of the semiconductor structure 100 depicting different cross-sectional views used to describe embodiments of the present disclosure.

The protective liner 410 is formed along opposite sidewalls of the nanosheet fins 20 and opposite sidewalls of the hardmask layer 302. The protective liner 410 protects the nanosheet fins 20 during a subsequent etching process. The protective liner 410 can be formed by a conformal liner deposition followed by anisotropic etch to remove the protective liner 410 from horizontal surfaces. Any suitable liner material, such as SiO2, SiN, SiOCN, SiBCN, SiC, TiN, AlOx, TiOx, and the like, can be used to form the protective liner 410. In one or more embodiments, the protective liner 410 may have a thickness varying from approximately 1 nm to approximately 5 nm, and ranges therebetween.

After forming the protecting liner 410, a reactive ion etching (RIE) can be conducted to etch through remaining portions of the first semiconductor layer 106 and the first sacrificial semiconductor layer 104 all the way until upper portions of the substrate 102 are removed, as illustrated in FIG. 4A.

Figure 5C:
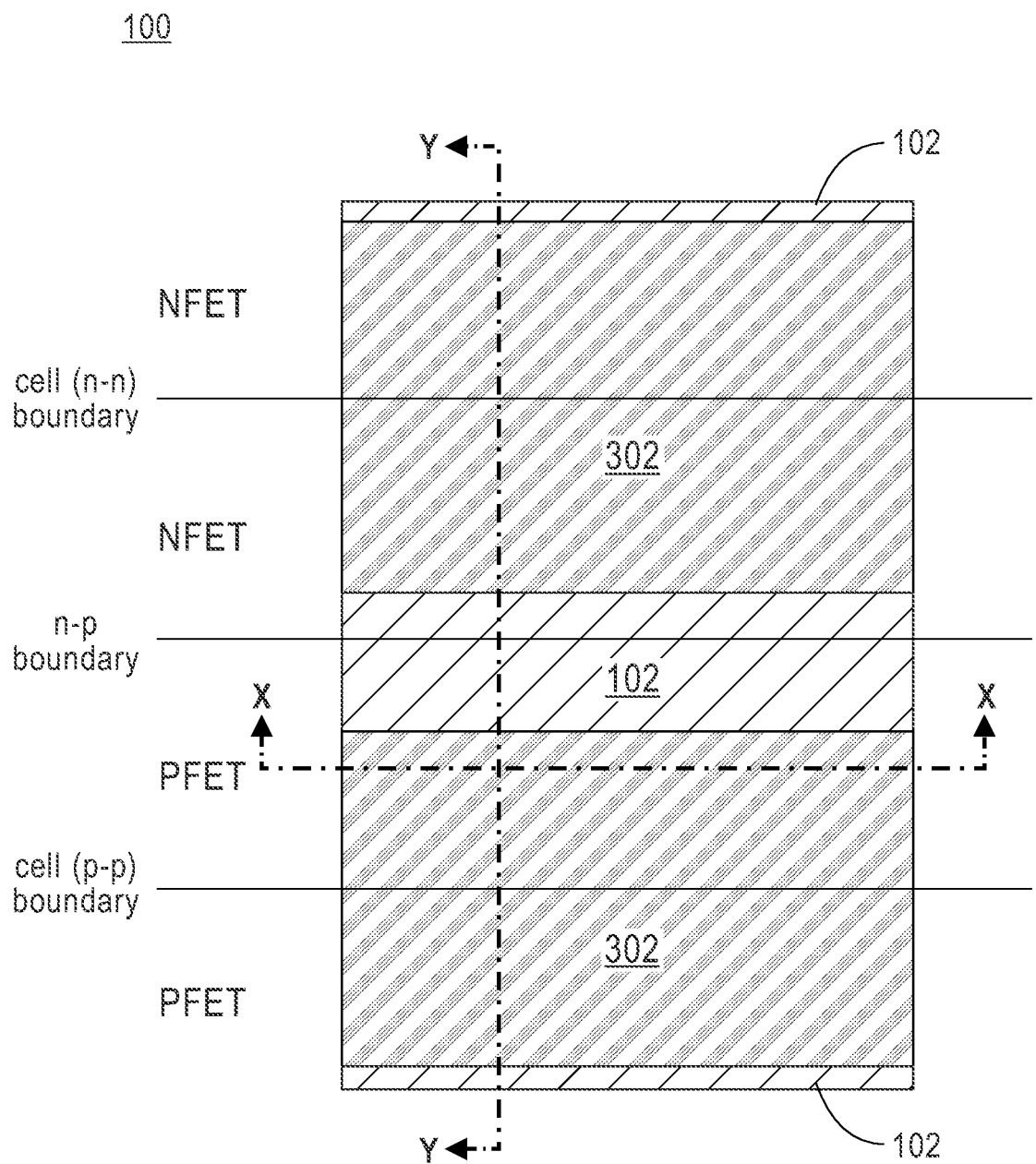
FIG. 5C is a top-down view of the semiconductor structure depicting different cross-sectional views used to describe embodiments of the present disclosure.

Referring now to FIG. 5A, a cross-sectional view of the semiconductor structure 100 is shown after recessing outer portions of the first sacrificial semiconductor layer 104, according to an embodiment of the present disclosure. In this embodiment, FIG. 5A is a cross-sectional view of the semiconductor structure 100 taken along Y-Y' depicted in FIG. 5C; FIG. 5B is a cross-sectional view of the semiconductor structure 100 taken along line X-X' depicted in FIG. 5C; and FIG. 5C is a top-down view of the semiconductor structure 100 depicting different cross-sectional views used to describe embodiments of the present disclosure.

In this embodiment, outer portions of the first sacrificial semiconductor layer 104 are selectively recessed (i.e., SiGe indentation) using, for example, a selective etch process such as a hydrogen chloride (HCl) gas etch. Preferably, the selected etch process for recessing the first sacrificial semiconductor layer 104 is capable of etching silicon germanium without attacking silicon. Etching the first sacrificial semiconductor layer 104 creates first indented cavities 520 between the first semiconductor layer 106 and the substrate 102, as depicted in FIG. 5A.

Figure 6C:
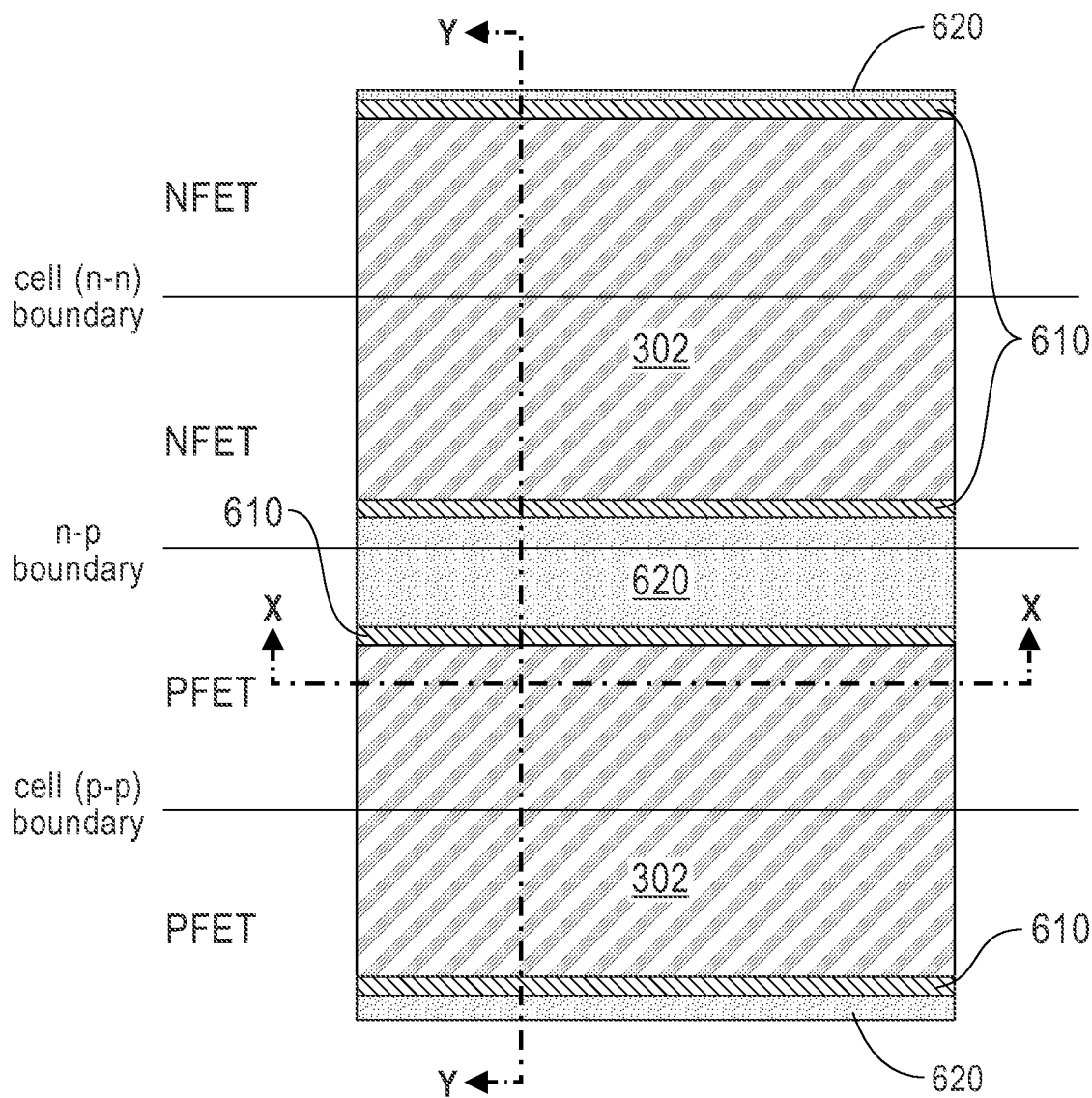
FIG. 6C is a top-down view of the semiconductor structure depicting different cross-sectional views used to describe embodiments of the present disclosure.

Referring now to FIG. 6A, a cross-sectional view of the semiconductor structure 100 is shown after selectively removing the protective liner 410 (FIG. 5A) and forming an isolation (dielectric) liner 610 followed by shallow trench isolation regions 620, according to an embodiment of the present disclosure. In this embodiment, FIG. 6A is a cross-sectional view of the semiconductor structure 100 taken along Y-Y' depicted in FIG. 6C; FIG. 6B is a cross-sectional view of the semiconductor structure 100 taken along line X-X' depicted in FIG. 6C; and FIG. 6C is a top-down view of the semiconductor structure 100 depicting different cross-sectional views used to describe embodiments of the present disclosure.

Non-limiting examples of etching techniques used to selectively remove the protective liner 410 (FIG. 5A) may include DHF clean (e.g., the protective liner 410 is composed of an oxide material), or SC1 clean (e.g., the protective liner 410 is composed of TiOx).

In an embodiment, after removing the protective liner 410 (FIG. 5A), the isolation liner 610 can be conformally deposited on the semiconductor structure 100 by, for example, chemical vapor deposition (CVD) or atomic layer deposition (ALD) of a silicon nitride (SiN) material. As depicted in FIG. 6A, the isolation liner 610 substantially fills the first indented cavities 520 shown in FIG. 5A. Vertical portions of the isolation liner 610 may have a thickness varying from approximately 3 nm to approximately 10 nm, and ranges therebetween.

After forming the isolation liner 610, remaining spaces within the semiconductor structure 100 can be filled with a dielectric material to form STI regions 620. In some embodiments, the dielectric material used to form the STI regions 620 may consist of any low-k dielectric material including, but not limited to, silicon nitride, silicon oxide, silicon oxy-nitride and fluoride-doped silicate glass. The dielectric material forming the STI regions 620 may be deposited using any suitable deposition method (e.g., CVD). In one or more embodiments, after forming the STI regions 620, excessive materials over the hardmask layer 302 can be removed by, for example, chemical mechanical polishing (CMP).

As can be observed in the figures, the dielectric material forming the STI regions 620 substantially fills remaining spaces within the semiconductor structure 100 located between an NFET region and a PFET region (i.e., N2P space). Shallow trench isolation regions, such as the STI regions 620, are frequently used in semiconductor technology to separate active regions within the substrate 102 and prevent electric current leakage between adjacent components. Thus, in this embodiment, the STI regions 620 are configured and arranged as shown in FIG. 6A and FIG. 6C to electrically isolate active regions (e.g., NFET region and PFET regions) of the semiconductor structure 100. As may be known by those skilled in the art, a planarization process (e.g., CMP) followed by an etching process (e.g., RIE) is conducted on the deposited dielectric material to form the STI regions 620 as depicted in the figures. According to an embodiment, the isolation liner 610 surrounds or wraps around each of the STI regions 620 for further improving isolation capabilities.

Figure 7C:
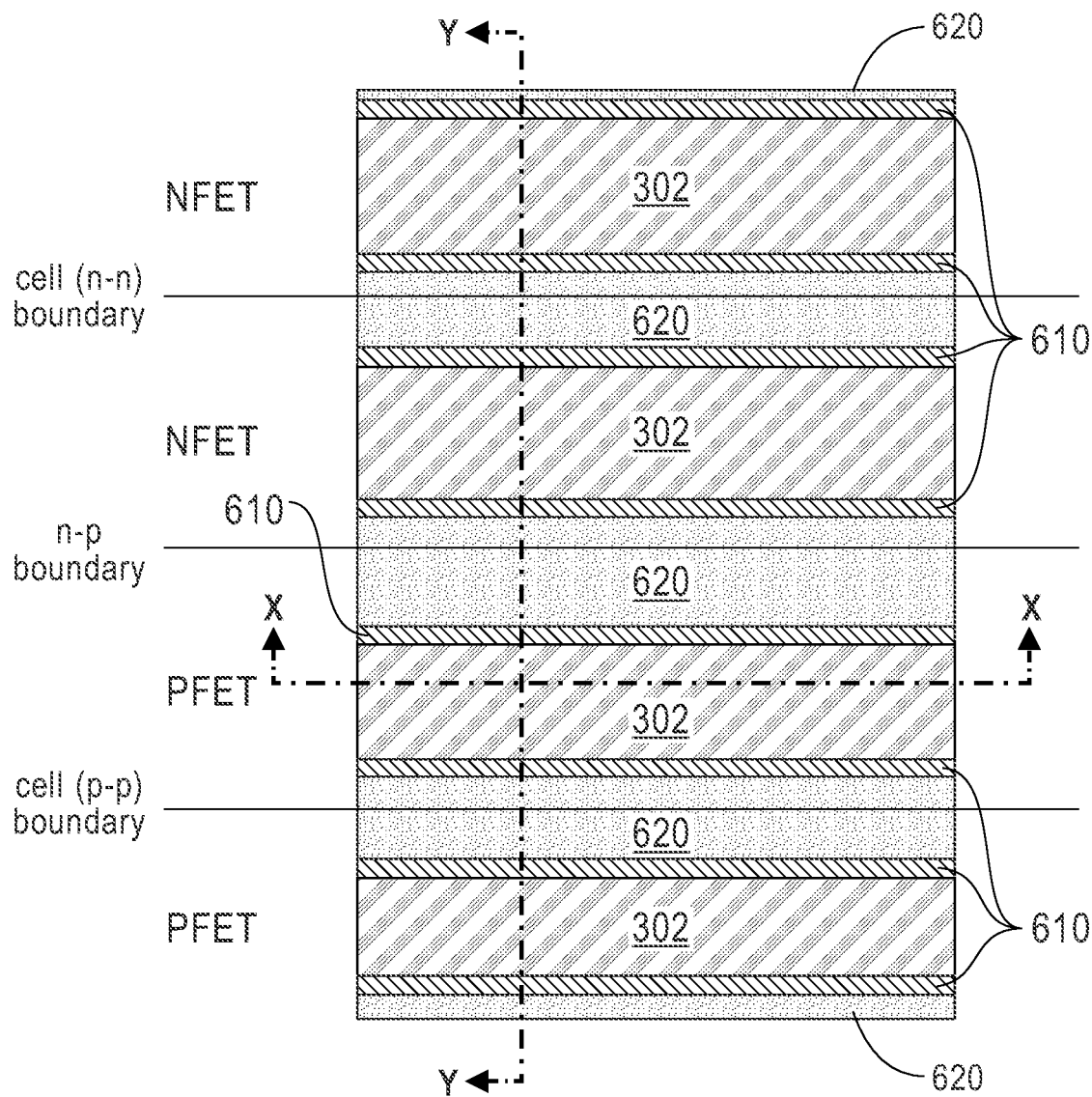
FIG. 7C is a top-down view of the semiconductor structure depicting different cross-sectional views used to describe embodiments of the present disclosure.

Referring now to FIG. 7A, a cross-sectional view of the semiconductor structure 100 is shown after forming STI regions 620 between cell boundaries, i.e., forming STI regions 620 between contiguous NFET regions (N2N space) and between contiguous PFET regions (P2P space), according to an embodiment of the present disclosure. In this embodiment, FIG. 7A is a cross-sectional view of the semiconductor structure 100 taken along Y-Y' depicted in FIG. 7C; FIG. 7B is a cross-sectional view of the semiconductor structure 100 taken along line X-X' depicted in FIG. 7C; and FIG. 7C is a top-down view of the semiconductor structure 100 depicting different cross-sectional views used to describe embodiments of the present disclosure.

In this embodiment, the process described above with reference to FIGS. 3A-6C for forming STI regions 620 between NFET and PFET regions, are implemented again in this step to form STI regions 620 between cell boundaries (i.e., N2N and P2P spaces), as illustrated in FIG. 7A and FIG. 7C. Thus, the STI regions 620 are configured and arranged as shown in FIG. 7A and FIG. 7C to electrically isolate NFET regions and PFET regions, as well as adjacent NFET regions and PFET regions. As mentioned above, the isolation liner 610 substantially surrounds or wraps around each of the STI regions 620, further improving their isolation capabilities. It should be noted that, in one or more embodiments, the isolation liner 610 completely replaces the first sacrificial semiconductor layer 104, and isolates the first semiconductor layer 106 from the substrate 102. Thus, the isolation liner 610 can act as an etch stop layer during a subsequent stage in which the substrate 102 will be removed.

Figure 8C:
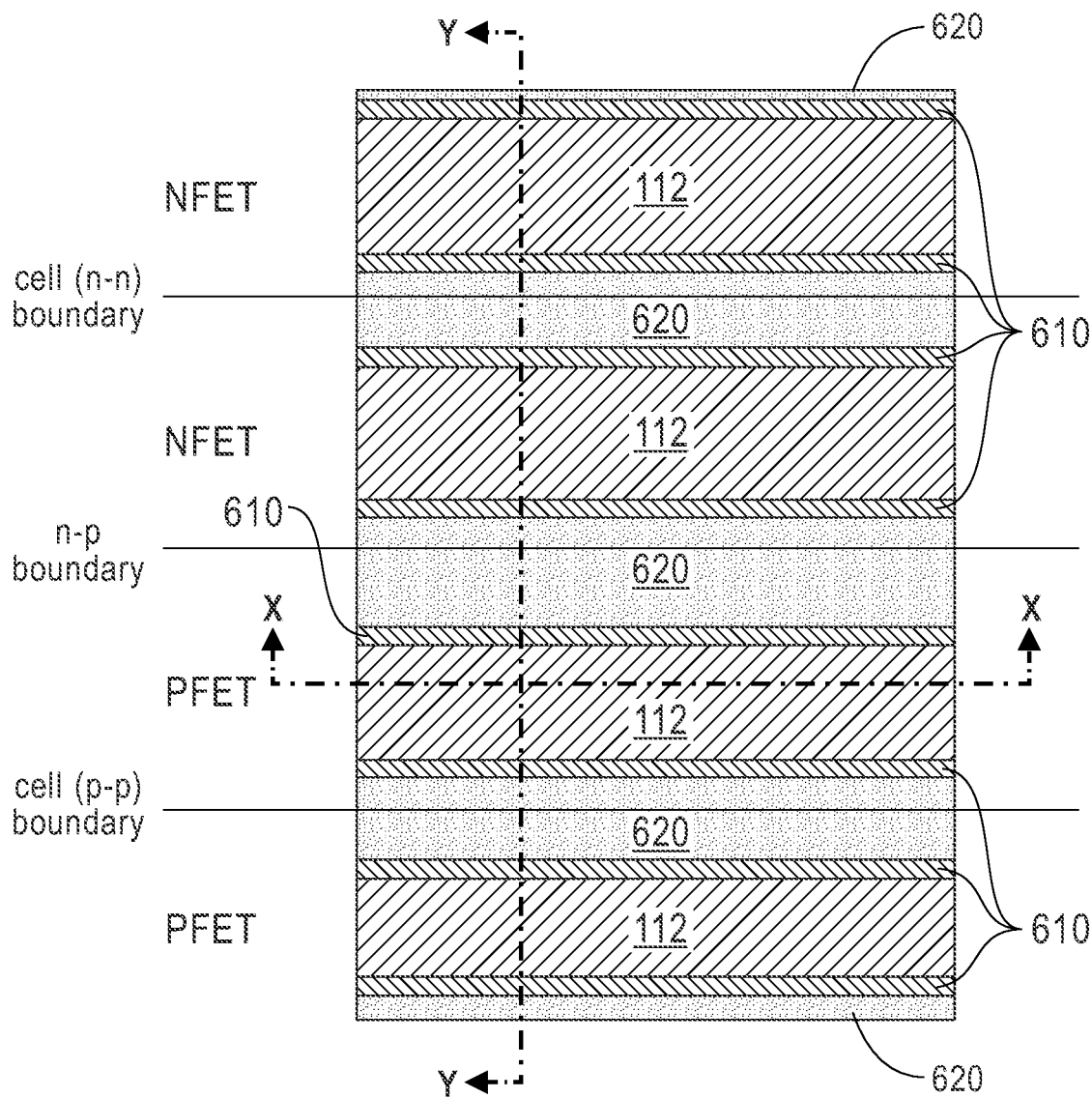
FIG. 8C is a top-down view of the semiconductor structure depicting different cross-sectional views used to describe embodiments of the present disclosure.

Referring now to FIG. 8A, a cross-sectional view of the semiconductor structure 100 is shown after revealing the nanosheet fins 20 and removing the hardmask layer 302 (FIGS. 7A-7C), according to an embodiment of the present disclosure. In this embodiment, FIG. 8A is a cross-sectional view of the semiconductor structure 100 taken along Y-Y' depicted in FIG. 8C; FIG. 8B is a cross-sectional view of the semiconductor structure 100 taken along line X-X' depicted in FIG. 8C; and FIG. 8C is a top-down view of the semiconductor structure 100 depicting different cross-sectional views used to describe embodiments of the present disclosure.

In this embodiment, an etch process is conducted on the semiconductor structure 100 to remove portions of the isolation liner 610 and STI regions 620 disposed along sidewalls of the nanosheet fins 20. As illustrated in FIG. 8A, the etching process can be conducted until top surfaces of the isolation liner 610 and STI regions 620 are substantially coplanar with a top surface of the first semiconductor layer 106 for revealing or uncovering the nanosheet fins 20. In one or more embodiments, the hardmask layer 302 (FIGS. 7A-7C) can also be removed during the etch process exposing a top surface of the nanosheet fins 20. In an exemplary embodiment, a wet etch process or a reactive-ion-etching (RIE) process can be performed on the semiconductor structure 100 to remove the isolation liner 610 and STI regions 620 from the nanosheet fins 20.

Figure 9C:
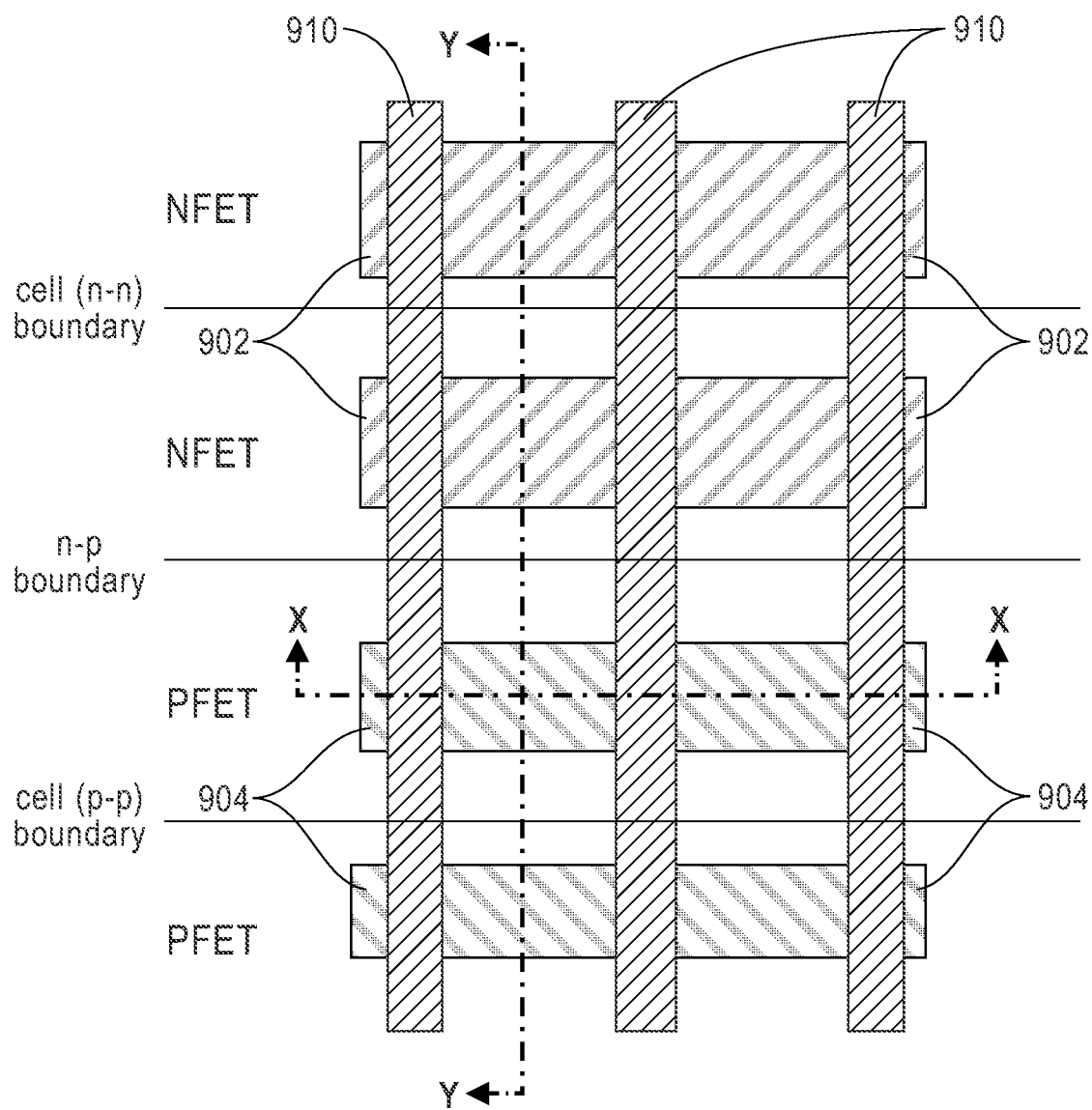
FIG. 9C is a top-down view of the semiconductor structure depicting different cross-sectional views used to describe embodiments of the present disclosure.

Referring now to FIG. 9A, a cross-sectional view of the semiconductor structure 100 is shown after completing front-end-of-line (FEOL) processing steps, according to an embodiment of the present disclosure. In this embodiment, FIG. 9A is a cross-sectional view of the semiconductor structure 100 taken along Y-Y' depicted in FIG. 9C; FIG. 9B is a cross-sectional view of the semiconductor structure 100 taken along line X-X' depicted in FIG. 9C; and FIG. 9C is a top-down view of the semiconductor structure 100 depicting different cross-sectional views used to describe embodiments of the present disclosure.

Known semiconductor fabrication operations have been used to form the semiconductor structure 100 as depicted in FIGS. 9A-9C. Thus, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Generally, at this step of the manufacturing process, a replacement gate 910, gate spacers 911, inner spacers 912, first source/drain regions 902, second source/drain regions 904, and an interlevel dielectric (ILD) layer 906 are formed in the semiconductor structure 100. This can be done by first forming a dummy gate (not shown) using conventional deposition, lithography and etching processes, followed by formation of the gate spacers 911 and nanosheet stack recess in the source/drain region(s). Subsequently, an outer portion of each of the second sacrificial semiconductor layers 110 (FIGS. 8A-8B) may be removed using methods known in the art. Inner spacers 912 may be formed within cavities (not shown) of the sacrificial semiconductor layers 110. As depicted in FIG. 9B, outer vertical sides of the inner spacers 912 may vertically align with the semiconductor channel layers 112. Inner spacers 912 can be formed, for example, by conformal deposition of an inner spacer material that pinches off the indented cavity (not shown) formed after recessing of the sacrificial semiconductor layers 110 followed by an isotropic etching process. The inner spacers 912 may include any suitable dielectric material, such as silicon dioxide or silicon nitride, and may include a single layer or multiple layers of dielectric materials.

After forming the inner spacers 912, the first source/drain regions 902 can be formed within NFET regions of the semiconductor structure 100. Similarly, the second source/drain regions 904 can be formed within PFET regions of the semiconductor structure 100, as depicted in FIG. 9C. The first and second source/drain regions 902, 904 can be formed using an epitaxial layer growth process on the exposed ends of the semiconductor channel layers 112. It should be noted that, in this embodiment, various elements of the semiconductor structure 100 are omitted from the top-down view of FIG. 9C for clarity of the orientation of the replacement gate 910 and active regions (i.e., first and second source/drain regions 902, 904).

According to an embodiment, first and second source/drain regions 902, 904 can be formed on opposing sides of the nanosheet fins 20 in direct contact with end portions of the semiconductor channel layers 112 and end portions of the inner spacers 912. For example, FIG. 9B depicts second source/drain regions 904 formed on opposing sides of the nanosheet fins 20 located on a PFET region of the semiconductor structure 100. Typically, after forming the first and second source/drain regions 902, 904, the interlevel dielectric layer 906 can be formed to fill voids in the semiconductor structure 100. The interlevel dielectric layer 906 can be formed by, for example, CVD of a dielectric material. Non-limiting examples of dielectric materials to form the interlevel dielectric layer 906 may include silicon oxide, silicon nitride, hydrogenated silicon carbon oxide, silicon based low-k dielectrics, flowable oxides, porous dielectrics, or organic dielectrics including porous organic dielectrics.

As known by those skilled in the art, after deposition of the interlevel dielectric layer 906, a planarization process (e.g., CMP) can be conducted on the semiconductor structure 100. This process may expose a top surface of a dummy gate structure (not shown) in preparation for a replacement metal gate process. In a gate-last fabrication process, the removed dummy gate (not shown) is thereafter replaced with a high-k metal gate structure, i.e., the replacement gate 910 as known in the art. According to an embodiment, the sacrificial semiconductor layers 110 (FIGS. 8A-8B) can now be removed from the semiconductor structure 100 using known etching processes including, for example, RIE, wet etch or dry gas (HCl). Removal of the sacrificial semiconductor layers 110 (FIGS. 8A-8B) create cavities (not shown) between the inner spacers 912 that will subsequently be filled with corresponding gate dielectric and work function metals to form the high-k metal gate structure or replacement gate 910, as depicted in FIGS. 9B-9C.

The replacement gate 910 includes gate dielectrics, such as hafnium oxide ($HfO_2$), zirconium dioxide ($ZrO_2$), hafnium-aluminum oxide (HfAlOx), hafnium-lanthanum oxide g (HfLaOx), etc., and one or more work function metals including, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). As can be appreciated in FIG. 9B, the replacement gate 910 surrounds (stacked) semiconductor channel layers 112. Additionally, in other embodiments, a gate cap (not shown) may be formed above the replacement gate 910.

After forming the replacement gate 910, a chemical mechanical polishing (CMP) may be conducted to remove excess material and polish upper surfaces of the semiconductor structure 100.

Figure 10C:
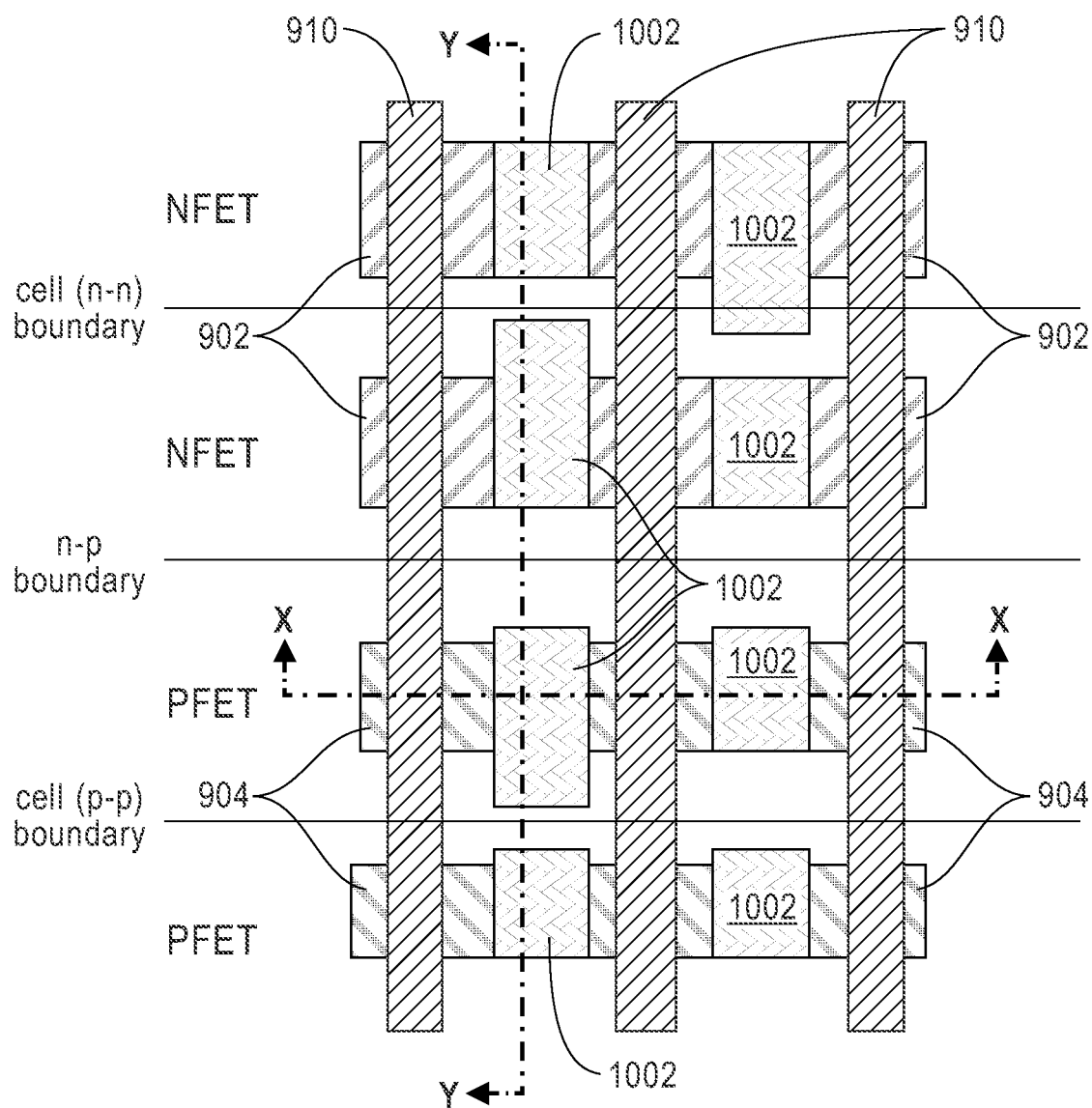
FIG. 10C is a top-down view of the semiconductor structure depicting different cross-sectional views used to describe embodiments of the present disclosure.

Referring now to FIG. 10A, a cross-sectional view of the semiconductor structure 100 is shown after middle-of-line (MOL) contact patterning and metallization, according to an embodiment of the present disclosure. In this embodiment, FIG. 10A is a cross-sectional view of the semiconductor structure 100 taken along Y-Y' depicted in FIG. 10C; FIG. 10B is a cross-sectional view of the semiconductor structure 100 taken along line X-X' depicted in FIG. 10C; and FIG. 10C is a top-down view of the semiconductor structure 100 depicting different cross-sectional views used to describe embodiments of the present disclosure.

As illustrated in the figure, a plurality of conductive structures including metal contacts 1002 and MOL vias 1004 are formed in the semiconductor structure 100 for electrically connecting FEOL devices to subsequently formed metal levels. The process of forming the metal contacts 1002 and MOL vias 1004 is standard and well-known in the art. Typically, the process includes forming trenches (not shown) within the interlevel dielectric layer 906 and subsequently filling the trenches with a conductive material or a combination of conductive materials to form the metal contacts 1002 and MOL vias 1004. In one or more embodiments, the conductive material filling the metal contacts 1002 and MOL vias 1004 may include a silicide liner (e.g., titanium (Ti), nickel (Ni), nickel-platinum (NiPt) alloy, etc.), a metal adhesion liner (e.g., titanium nitride (TiN)), and a conductive metal (e.g., aluminum (Al), tungsten (W), copper (Co), ruthenium (Ru), or any combination thereof).

The conductive material may be deposited by a suitable deposition process, for example, CVD, PECVD, PVD, plating, thermal or e-beam evaporation, or sputtering. A planarization process, for example, CMP, is performed to remove any conductive material from upper surfaces of the semiconductor structure 100. Specifically, in the depicted example, the metal contacts 1002 include source/drain contacts that extend until an uppermost surface of each of the first and second source/drain regions 902, 904. Although not shown in the figure, gate contacts to the replacement gate 910 may also be formed in the semiconductor structure 100 using similar conductive materials and analogous processing techniques.

In addition to the metal contacts 1002 and MOL vias 1004, a via-to-backside power rail (VBPR) 1010 can also be formed in the semiconductor structure 100. The VBPR 1010 may electrically connect the semiconductor structure 100 to a subsequently formed backside power rail (BPR), as will be described in detail below. The VBPR 1010 can be formed using similar conductive materials and analogous processing techniques as those used to form the metal contacts 1002 and MOL vias 1004. According to an embodiment, the VBPRs 1010 can be formed between neighboring first source/drain regions 902 (N2N space) and between neighboring second source/drain regions 902 (P2P space). More particularly, the VBPRs 1010 can be formed adjacent to, and electrically in contact with, at least one metal contact 1002, as shown in FIG. 10A. In the depicted embodiment, the VBPR 1010 extend all the way from a top surface of at least one metal contact 1002 to a top surface of the isolation liner 610 (or a bottommost surface of the STI regions 620).

Figure 11C:
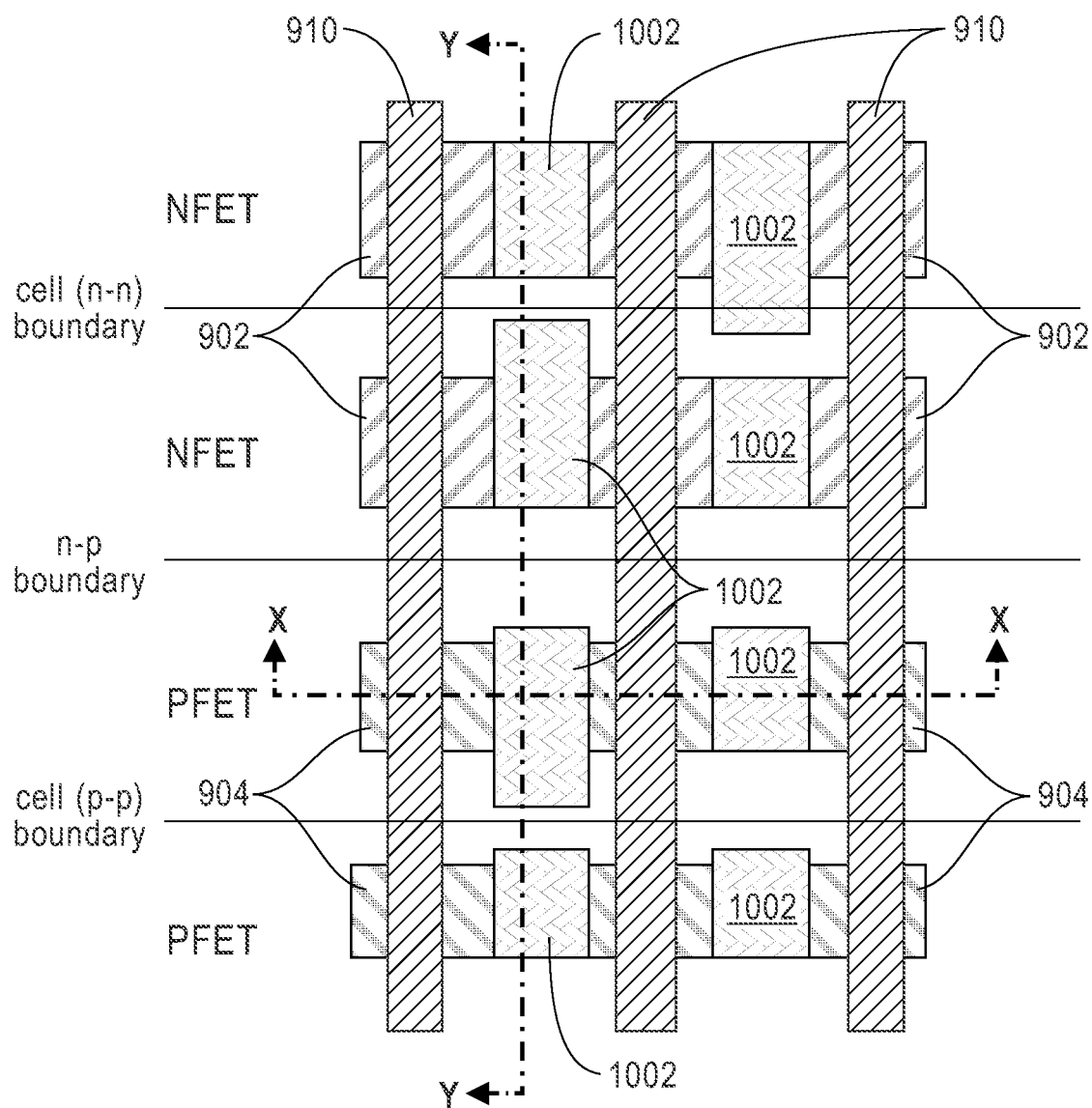
FIG. 11C is a top-down view of the semiconductor structure depicting different cross-sectional views used to describe embodiments of the present disclosure.
Figure 12C:
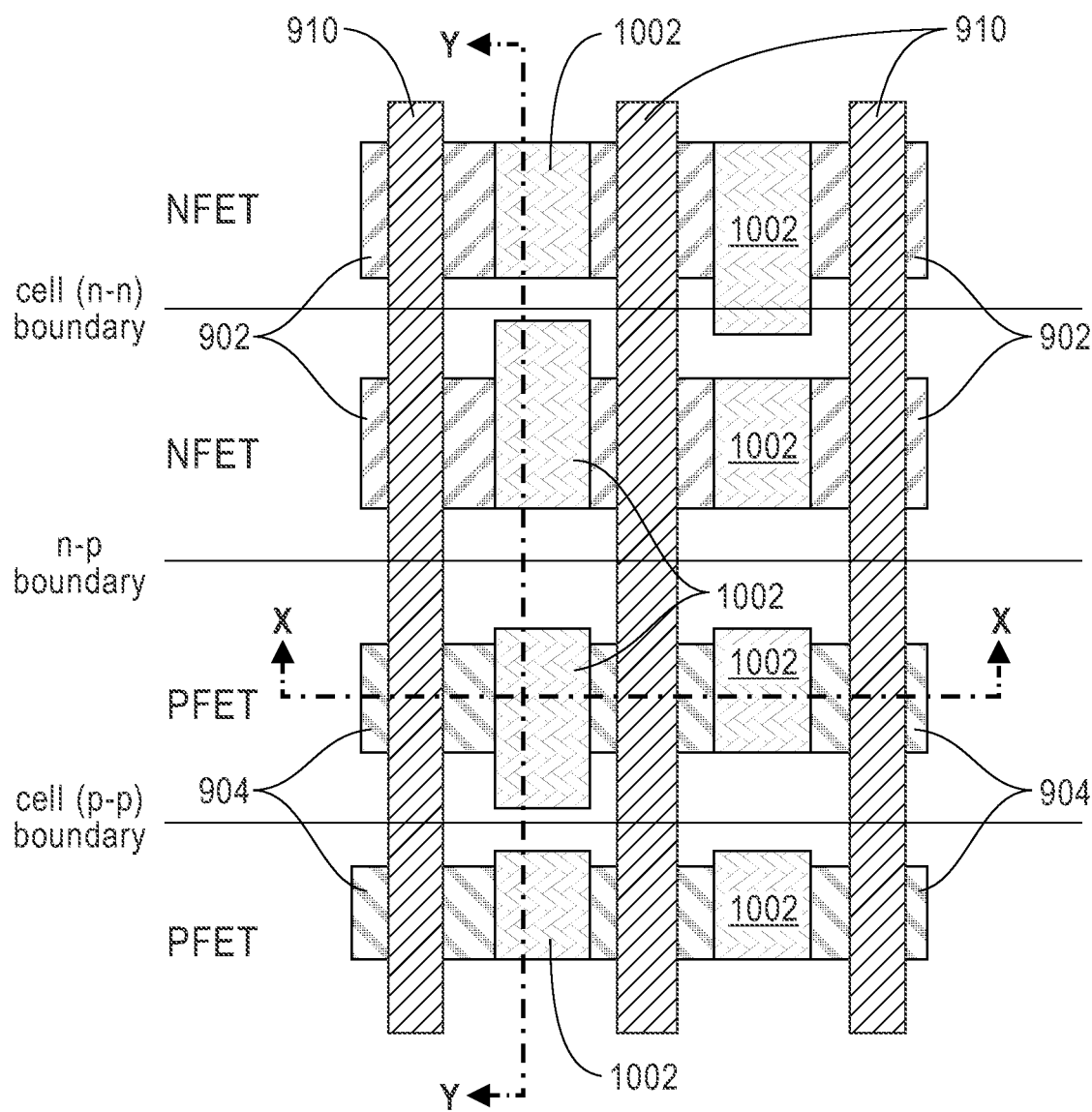
FIG. 12C is a top-down view of the semiconductor structure depicting different cross-sectional views used to describe embodiments of the present disclosure.

Referring now to FIG. 11A, a cross-sectional view of the semiconductor structure 100 is shown after forming a back-end-of-line (BEOL) interconnect level 1110 and a carrier wafer 1112, according to an embodiment of the present disclosure. In this embodiment, FIG. 11A is a cross-sectional view of the semiconductor structure 100 taken along Y-Y' depicted in FIG. 11C; FIG. 11B is a cross-sectional view of the semiconductor structure 100 taken along line X-X' depicted in FIG. 11C; and FIG. 11C is a top-down view of the semiconductor structure 100 depicting different cross-sectional views used to describe embodiments of the present disclosure.

In this embodiment, a BEOL interconnect level 1110 is formed above the FEOL device level 30 of the semiconductor structure 100. The BEOL interconnect level 1110 is electrically connected to the FEOL device level 30 through the MOL vias 1004 located above respective (source/drain) metal contacts 1002, as depicted in FIGS. 11A-11B. Although not depicted in the figures, the BEOL interconnect level 1110 typically includes contacts, insulating layers (dielectrics), metal levels, and bonding sites for chip-to-package connections, as may be known by those skilled in the art. As mentioned above, various steps in the manufacture of semiconductor devices and semiconductor-based ICs are well known and so, in the interest of brevity, many conventional steps will only be mentioned briefly herein or will be omitted entirely without providing the well-known process details.

According to an embodiment, after forming the BEOL interconnect level 1110, the semiconductor structure 100 (i.e., the semiconductor wafer) is bonded to the carrier wafer (or auxiliary substrate) 1112. The carrier wafer 1112 may act as a reinforcing substrate for providing mechanical strength during processing (e.g., thinning) of the semiconductor wafer. The process of bonding the semiconductor wafer to the carrier wafer 1112 can be achieved by conventional wafer bonding process, such as dielectric-to-dielectric bonding or Cu-to-Cu bonding.

Accordingly, the carrier wafer 1112 may include silicon oxide layers or SiCN layers, or any other layers applicable in the direct bonding technology applied in state of the art packaging techniques. Bonding of the device wafer to the carrier wafer 1112 takes place by such known direct bonding techniques, thus obtaining the assembly shown in FIGS. 12A-12C after the wafer is flipped.

Figure 13C:
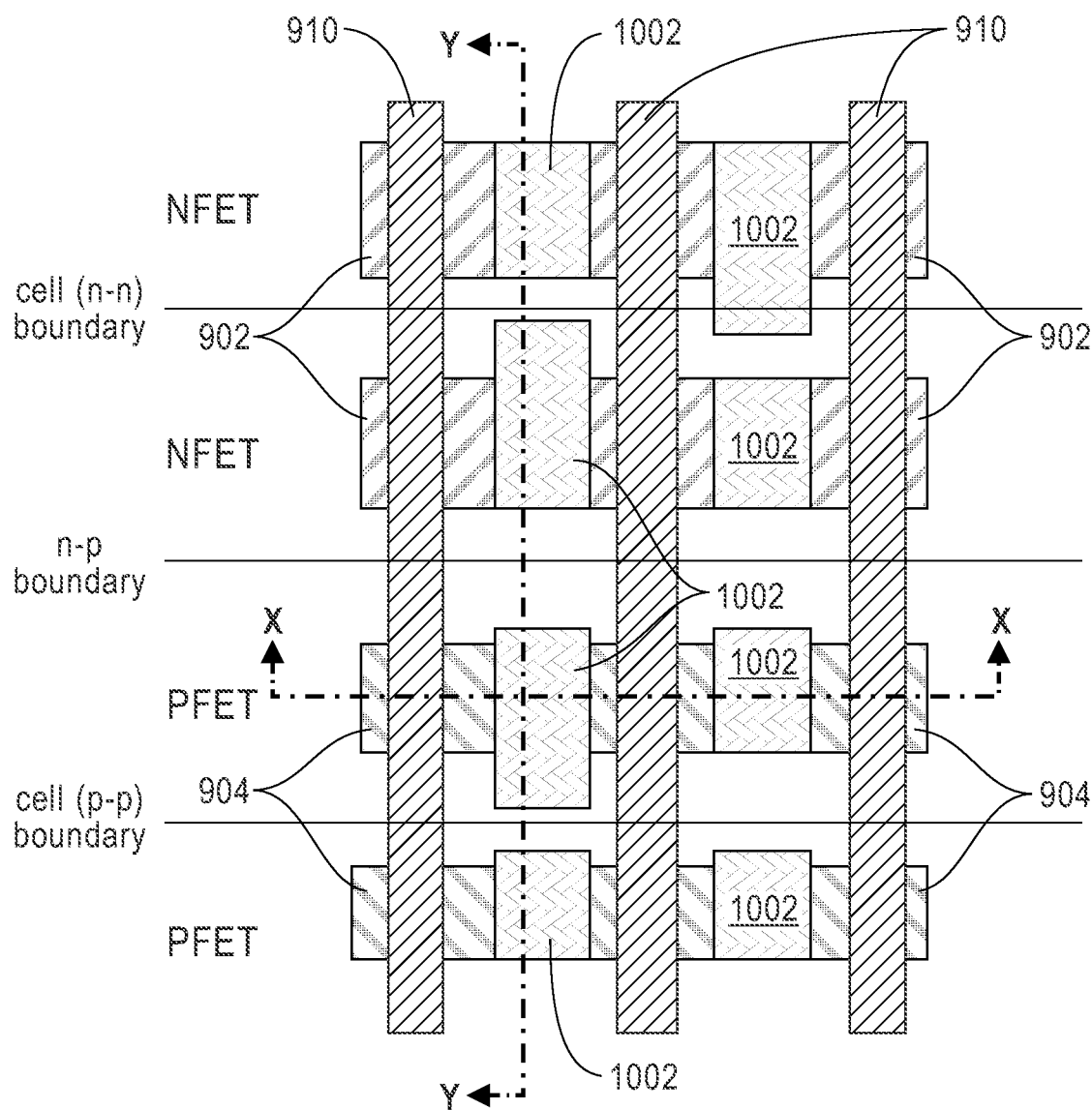
FIG. 13C is a top-down view of the semiconductor structure depicting different cross-sectional views used to describe embodiments of the present disclosure.

Referring now to FIG. 13A, a cross-sectional view of the semiconductor structure 100 is shown after grinding the substrate 102, according to an embodiment of the present disclosure. In this embodiment, FIG. 13A is a cross-sectional view of the semiconductor structure 100 taken along Y-Y' depicted in FIG. 13C; FIG. 13B is a cross-sectional view of the semiconductor structure 100 taken along line X-X' depicted in FIG. 13C; and FIG. 13C is a top-down view of the semiconductor structure 100 depicting different cross-sectional views used to describe embodiments of the present disclosure.

In the depicted embodiment, the substrate 102 (FIGS. 12A-12B) is subsequently removed using regular grinding, CMP and selective etching processes including wet or dry etching techniques. According to an embodiment, the grinding process is conducted until substantially removing the substrate 102 from the semiconductor structure 100 and only a few microns of Si remains. After that, an optional CMP process can be further used to reduce the thickness variation, and finally a highly selective Si etching process is used to remove the remaining substrate 102 from the semiconductor structure 100. According to an embodiment, the (dielectric) isolation liner 610 act as an etch stop during the highly selective Si removal process, preventing excessive Si etch which may damage the replacement gate 910 and the first and second source/drain regions 902, 904.

Figure 14C:
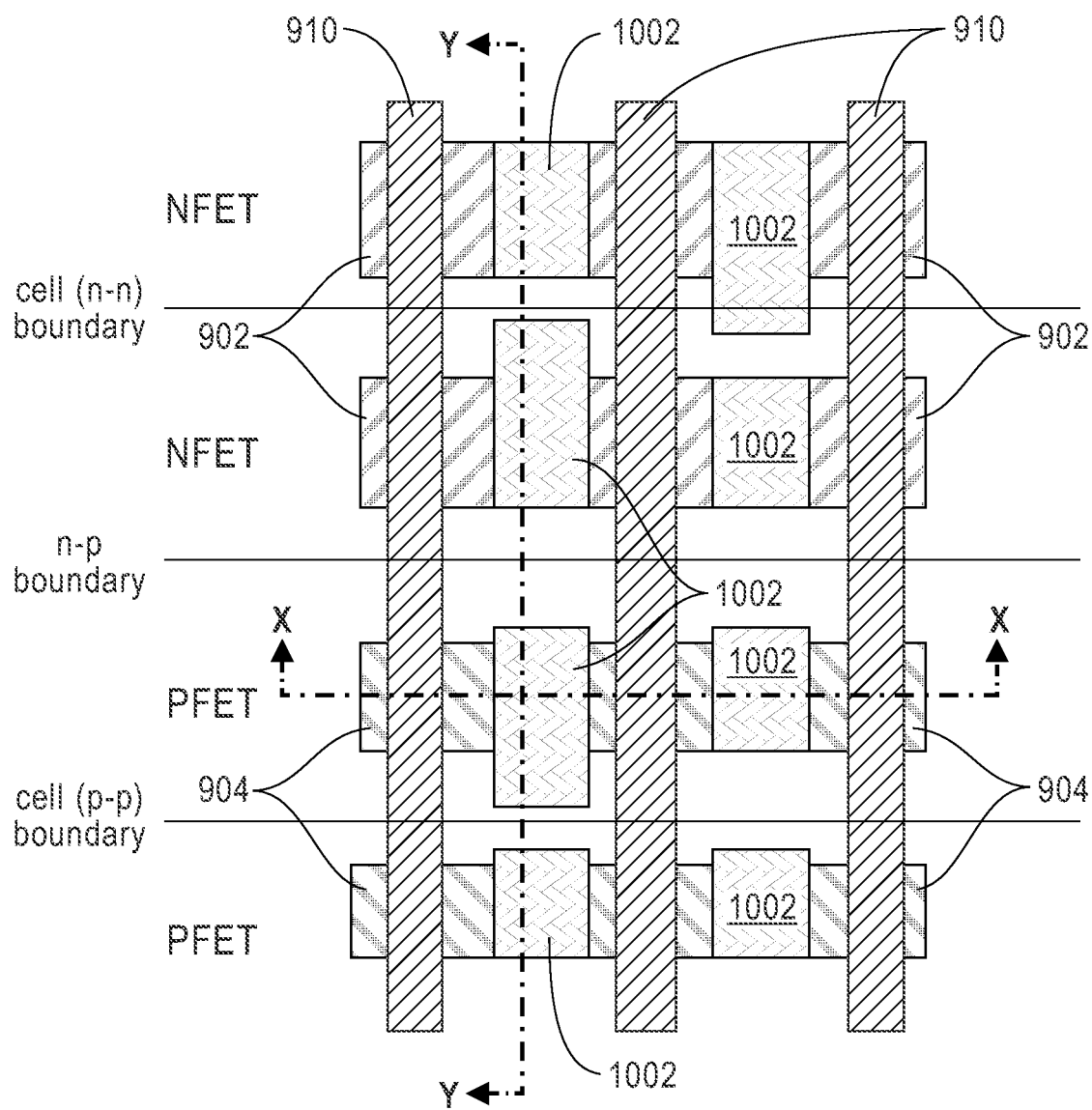
FIG. 14C is a top-down view of the semiconductor structure depicting different cross-sectional views used to describe embodiments of the present disclosure.

Referring now to FIG. 14A, a cross-sectional view of the semiconductor structure 100 is shown after forming a backside interlayer dielectric 1402, according to an embodiment of the present disclosure. In this embodiment, FIG. 14A is a cross-sectional view of the semiconductor structure 100 taken along Y-Y' depicted in FIG. 14C; FIG. 14B is a cross-sectional view of the semiconductor structure 100 taken along line X-X' depicted in FIG. 14C; and FIG. 14C is a top-down view of the semiconductor structure 100 depicting different cross-sectional views used to describe embodiments of the present disclosure.

The backside interlayer dielectric (BILD) 1402 is formed using standard methods and materials, such as those used to form the interlevel dielectric layer 906 described above with reference to FIGS. 9A-9C. As depicted in FIGS. 14A-14B, the BILD 1402 is disposed above the isolation liner 610. In an exemplary embodiment, a thickness of the BILD 906 may vary between approximately 40 nm to approximately 300 nm, and ranges therebetween.

Figure 15C:
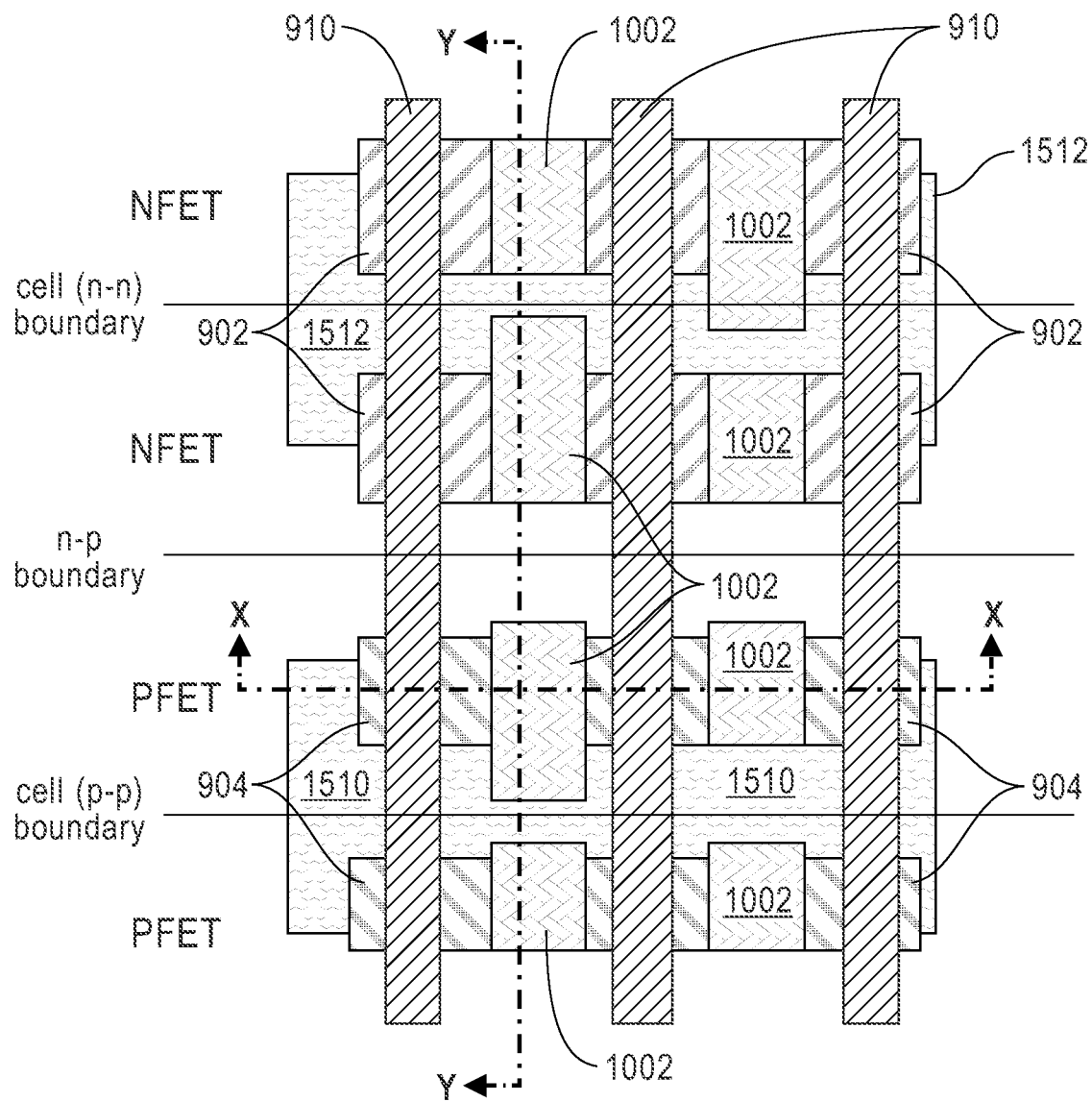
FIG. 15C is a top-down view of the semiconductor structure depicting different cross-sectional views used to describe embodiments of the present disclosure.

Referring now to FIG. 15A, a cross-sectional view of the semiconductor structure 100 is shown after backside power rail patterning and metallization, according to an embodiment of the present disclosure. In this embodiment, FIG. 15A is a cross-sectional view of the semiconductor structure 100 taken along Y-Y' depicted in FIG. 15C; FIG. 15B is a cross-sectional view of the semiconductor structure 100 taken along line X-X' depicted in FIG. 15C; and FIG. 15C is a top-down view of the semiconductor structure 100 depicting different cross-sectional views used to describe embodiments of the present disclosure.

In this embodiment, backside power rails (BPRs) 1510, 1512 are formed within the BILD 1402. The process of forming the BPRs 1510, 1512 includes patterning a backside power rail trench (not shown) in the BILD 1402, for example, by conventional lithography and reactive ion etching. In the depicted example, the backside power rail trench (not shown) is etched until reaching an uppermost surface of the VBPR 1010, as shown in FIG. 15A. In some embodiments, the aspect ratio of the backside power rail trench (not shown) may be about 0.5 to 5.0.

To form the BPRs 1510, 1512, the backside power rail trenches (not shown) can be filled with a conductive metal. The choice of metallization for backside power rails is based on where in the integration flow the rail is formed and metalized. In the depicted embodiment, the BPRs 1510, 1512 are formed in the backside of the semiconductor structure 100. In such instances the BPRs 1510, 1512 may be formed by depositing, for example, a layer of ruthenium (Ru) or Cu. In other embodiments, the conductive metal forming the BPRs 1510, 1512 may include Co, W, Al, and the like. According to an embodiment, the backside BPRs 1510, 1512 are electrically connected to one or more (source/drain) metal contacts 1002 through the VBPR 1010 for supplying power to the devices (e.g., field effect transistors) in the FEOL level 30 (FIGS. 12A-12B).

More particularly, in this embodiment, the BPR 1510 may include a VDD rail embedded in the PFET region of the semiconductor structure 100, while the BPR 1512 may include a VSS rail embedded in the NFET region of the semiconductor structure 100, as depicted in FIG. 15A and FIG. 15C, respectively. Thus, in the depicted embodiment, the BPR 1510 (VDD rail) is electrically connected to a first source/drain region 902 through the VBPR 1010 (located between adjacent first source/drain regions 902) and at least one (source/drain) metal contact 1002. Similarly, the BPR 1512 (VSS rail) is electrically connected to a second source/drain region 904 through the VBPR 1010 (located between adjacent second source/drain regions 904) and at least another (source/drain) metal contact 1002.

It should be noted that first and second source/drain regions 902, 904 wired to the backside power rails (i.e., BPRs 1510,1512) are not connected to the BEOL interconnect level 1110. As depicted in FIGS. 15A-15B, the BEOL interconnect level 1110 may be electrically connected to one or more metal contacts 1002 without a VBPR 1010 through the MOL vias 1004. Those metal contacts 1002 including or electrically connected to a VBPR 1010 are (electrically) separated from the BEOL interconnect level 1110 by the interlevel dielectric layer 906, as shown in the figures.

Figure 16C:
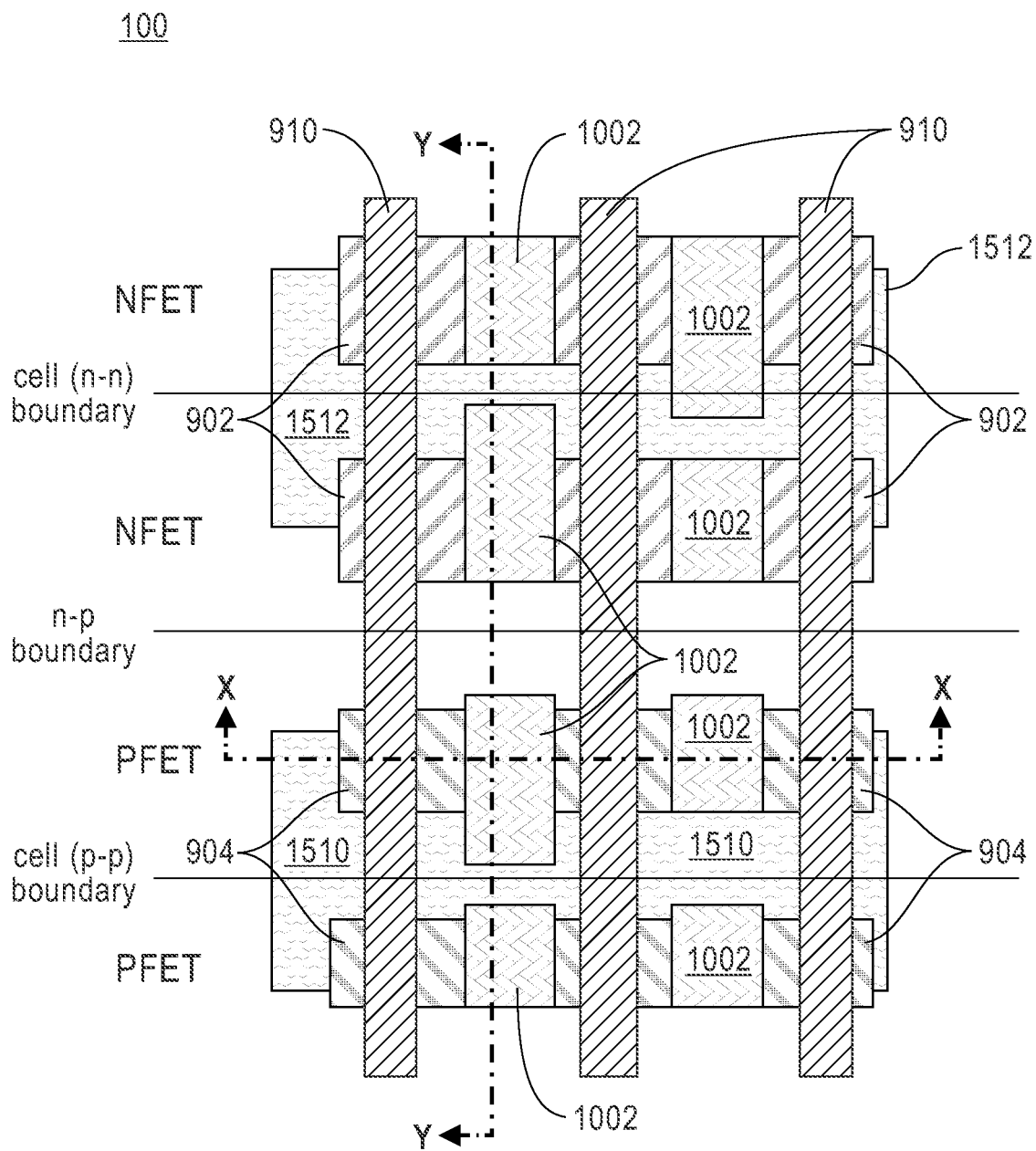
FIG. 16C is a top-down view of the semiconductor structure depicting different cross-sectional views used to describe embodiments of the present disclosure.

Referring now to FIG. 16A, a cross-sectional view of the semiconductor structure 100 is shown after forming a backside power delivery network (PDN) 1620, according to an embodiment of the present disclosure. In this embodiment, FIG. 16A is a cross-sectional view of the semiconductor structure 100 taken along Y-Y' depicted in FIG. 16C; FIG. 16B is a cross-sectional view of the semiconductor structure 100 taken along line X-X' depicted in FIG. 16C; and FIG. 16C is a top-down view of the semiconductor structure 100 depicting different cross-sectional views used to describe embodiments of the present disclosure.

The structure of the PDN 1620 can be made according to known techniques. Depending on the exact function of the transistor arrangement, a number of the first and second source/drain regions 902, 904 may be connected to backside power and ground via the VBPR 1010. As mentioned above, the VBPR 1010 is a metal area placed between first source/drain regions 902 (N2N space) and between second source/drain regions 904 (N2N space), i.e., between source/drain regions of similar polarity. According to an embodiment, the VBPR 1010 is in contact with a bottom surface of the BPRs 1510, 1512, and embedded in an intermediate STI region 620 (located between same polarity regions) and the interlevel dielectric layer 906 (known as the pre-metal dielectric, i.e., this is the layer known in the art on top of which the BEOL layers are built). According to an embodiment, the VBPR 1010 represents a lateral connection between at least one first source/drain region 902 and a BPR 1510, and a lateral connection between at least one second source/drain region 904 and a BPR 1512.

It should be noted that the BEOL interconnect level 1110 in the semiconductor structure 100 manufactured according to the disclosed technology is separated from the PDN 1620, thereby increasing the routing resources in the semiconductor structure 100 for signal wirings in the BEOL level.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor structure comprising:
   a front-end-of-line level including a plurality of field effect transistors electrically connected to a back-end-of-line interconnect level located on a first side of the front-end-of-line level;
   a plurality of shallow trench isolation regions located between adjacent field effect transistors, each of the plurality of shallow trench isolation regions being surrounded by a dielectric isolation liner;

a backside power rail within a backside interlayer dielectric located on a second side of the front-end-of-line level opposing the first side of the front-end-of-line level; and a via-to-backside power rail embedded, at least in part, within a shallow trench isolation region located between two field effect transistors of a similar polarity, the via-to-backside power rail being adjacent and electrically connected to at least one metal contact and extending from the at least one metal contact to a first surface of the backside power rail.

2. The semiconductor structure of claim 1, wherein the plurality of field effect transistors further comprises a source/drain region.

3. The semiconductor structure of claim 2, wherein the at least one metal contact is located between a first surface of the source/drain region of each field effect transistor and an interlevel dielectric layer, wherein at least one another metal contact is electrically connected to the back-end-of-line interconnect level through a middle-of-line via.

4. The semiconductor structure of claim 3, further comprising:
a first semiconductor layer, wherein a first surface of the first semiconductor layer is in contact with a second surface of the source/drain region of each field effect transistor opposing the first surface of the source/drain region.

5. The semiconductor structure of claim 1, further comprising:
a power delivery network above and in electric contact with a second surface of the backside power rail and a second surface of the backside interlayer dielectric.

6. The semiconductor structure of claim 1, further comprising:
a carrier wafer in contact with a second surface of the back-end-of-line interconnect level opposing the first surface of the back-end-of-line interconnect level.

7. The semiconductor structure of claim 1, wherein the plurality of field effect transistors includes P-field effect transistors and N-field effect transistors.

8. The semiconductor structure of claim 1, wherein the plurality of field effect transistors includes a plurality of nanosheet field effect transistors.

9. A semiconductor structure comprising:
a front-end-of-line level including a plurality of field effect transistors, each field effect transistor including a source/drain region;
a plurality of conductive structures within an interlevel dielectric layer, each of the plurality of conductive structures being located on a first surface of the source/drain region of each field effect transistor;
a back-end-of-line interconnect level being located above a first surface of the interlevel dielectric layer opposing the first surface of the source/drain region;
a first semiconductor layer, wherein a first surface of the first semiconductor layer is in contact with a second surface of the source/drain region of each field effect transistor opposing the first surface of the source/drain region;
a plurality of shallow trench isolation regions located between adjacent field effect transistors;
an isolation liner surrounding each of the plurality of shallow trench isolation regions, the isolation liner being located between each of the plurality of shallow trench isolation regions and the first semiconductor layer and above a second surface of the first semiconductor layer opposing the second surface of the source/drain region;

a via-to-backside power rail embedded, at least in part, within a shallow trench isolation region located between two field effect transistor of a similar polarity, the via-to-backside power rail being adjacent, and electrically connected, to a first side of at least one conductive structure, wherein the isolation liner is located along sidewalls of a portion of the via-to-backside power rail within the shallow trench isolation region, at least another conductive structure being electrically connected to the back-end-of-line interconnect level through a middle-of-line via; and a backside power rail within a backside interlayer dielectric, a first surface of the backside interlayer dielectric being in contact with the isolation liner, the via-to-backside power rail extending from the at least one conductive structure to a first surface of the backside power rail.

10. The semiconductor structure of claim 9, further comprising:
a power delivery network in contact with a second surface of the backside power rail and a second surface of the backside interlayer dielectric.

11. The semiconductor structure of claim 9, further comprising:
a carrier wafer in contact with a second surface of the back-end-of-line interconnect level.

12. The semiconductor structure of claim 9, wherein the plurality of field effect transistors includes P-field effect transistors and N-field effect transistors.

13. The semiconductor structure of claim 9, wherein the plurality of field effect transistors includes a plurality of nanosheet field effect transistors.

14. A method of forming a semiconductor structure, comprising:
forming a front-end-of-line level including a plurality of field effect transistors electrically connected to a back-end-of-line interconnect level located on a first side of the plurality of field effect transistors through a middle-of-line via;
forming a plurality of shallow trench isolation regions located between adjacent field effect transistors, each of the plurality of shallow trench isolation regions being surrounded by a dielectric isolation liner;
forming a backside power rail within a backside interlayer dielectric located on a second side of the plurality of field effect transistors opposing the first side; and
forming a via-to-backside power rail embedded, at least in part, within a shallow trench isolation region located between two field effect transistors including a similar polarity, the via-to-backside power rail being adjacent and electrically connected to at least one metal contact and extending from the at least one metal contact to a first surface of the backside power rail.

15. The method of claim 14, wherein the plurality of field effect transistors further comprises a source/drain region.

16. The method of claim 15, wherein the at least one metal contact is located between a first surface of the source/drain region of each field effect transistor and an interlevel dielectric layer, wherein at least one another metal contact is electrically connected to the back-end-of-line interconnect level through the middle-of-line via, and wherein the method further comprises:

forming a first semiconductor layer, wherein a first surface of the first semiconductor layer is in contact with a second surface of the source/drain region of each field effect transistor.

17. The semiconductor structure of claim 1, wherein the backside interlayer dielectric is selected from a group consisting of: a silicon nitride, and a porous organic dielectric.

18. The semiconductor structure of claim 1, wherein a thickness of the backside interlayer dielectric is between 40 nm and 300 nm.

19. The semiconductor structure of claim 1, wherein the backside power rail is contained within the backside interlayer dielectric.

20. The semiconductor structure of claim 4, wherein the first surface of the semiconductor layer is coplanar with a first surface of a first shallow trench isolation region and a first surface of a first dielectric isolation liner.

* * * * *